(12) United States Patent
Yang et al.

(10) Patent No.: US 9,818,824 B2
(45) Date of Patent: Nov. 14, 2017

(54) SEMICONDUCTOR SUBSTRATE AND SEMICONDUCTOR DEVICE INCLUDING THE SAME

(71) Applicants: Moon Seung Yang, Hwaseong-si (KR); Eun Hye Choi, Suwon-si (KR); Sun Jung Kim, Suwon-si (KR); Seung Hun Lee, Hwaseong-si (KR); Hyun-Jung Lee, Suwon-si (KR)

(72) Inventors: Moon Seung Yang, Hwaseong-si (KR); Eun Hye Choi, Suwon-si (KR); Sun Jung Kim, Suwon-si (KR); Seung Hun Lee, Hwaseong-si (KR); Hyun-Jung Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/968,049

(22) Filed: Dec. 14, 2015

(65) Prior Publication Data
US 2016/0218181 A1 Jul. 28, 2016

(30) Foreign Application Priority Data
Jan. 23, 2015 (KR) ........................ 10-2015-0011490

(51) Int. Cl.
*H01L 29/161* (2006.01)
*H01L 29/10* (2006.01)
(Continued)

(52) U.S. Cl.
CPC ...... *H01L 29/1054* (2013.01); *H01L 21/0245* (2013.01); *H01L 21/0251* (2013.01);
(Continued)

(58) Field of Classification Search
CPC ............. H01L 29/1054; H01L 29/7848; H01L 29/785; H01L 29/161; H01L 21/02381;
(Continued)

(56) References Cited

U.S. PATENT DOCUMENTS 6,649,492 B2 11/2003 Chu et al.
6,876,010 B1 4/2005 Fitzgerald
(Continued)

FOREIGN PATENT DOCUMENTS

| JP | 2007-088213 | 4/2007 |
|----|-------------|--------|
| JP | 2007-288165 | 11/2007 |
| KR | 1020130083198 | 7/2013 |

OTHER PUBLICATIONS

Shah, V.A., et al., "Reverse graded related buffers for high Ge content SiGe virtual substrates", Applied Physics Letters 93, 192103, 2008, 3 pages.
(Continued)

*Primary Examiner* — Mark Tornow
(74) *Attorney, Agent, or Firm* — Myers Bigel, P.A.

(57) ABSTRACT

A semiconductor substrate and a semiconductor device are provided. The semiconductor substrate includes a base substrate, a first silicon germanium layer on the base substrate and a second silicon germanium layer on the first silicon germanium layer. A germanium fraction of the second silicon germanium layer decreases in the direction away from the base substrate, and a germanium fraction of a lowermost part of the second silicon germanium layer is greater than a germanium fraction of an uppermost part of the first silicon germanium layer.

25 Claims, 30 Drawing Sheets

(51) Int. Cl.
*H01L 29/78* (2006.01)
*H01L 21/02* (2006.01)

(52) U.S. Cl.
CPC .. *H01L 21/02381* (2013.01); *H01L 21/02488* (2013.01); *H01L 21/02505* (2013.01); *H01L 21/02532* (2013.01); *H01L 29/785* (2013.01); *H01L 29/7848* (2013.01); *H01L 29/161* (2013.01)

(58) Field of Classification Search
CPC ........... H01L 21/0245; H01L 21/02488; H01L 21/02505; H01L 21/0251; H01L 21/02532
See application file for complete search history.

(56) References Cited

U.S. PATENT DOCUMENTS

| | | | |
|---|---|---|---|
| 6,893,936 B1 | 5/2005 | Chen et al. | |
| 7,198,997 B2 | 4/2007 | Shiono et al. | |
| 7,608,496 B2 | 10/2009 | Chu | |
| 7,785,995 B2 | 8/2010 | Cody et al. | |
| 8,034,654 B2 * | 10/2011 | Chang | H01L 31/1812 257/E27.123 |
| 8,129,747 B2 | 3/2012 | Westhoff et al. | |
| 2005/0196925 A1 | 9/2005 | Kim et al. | |
| 2006/0145188 A1 * | 7/2006 | Dantz | C30B 25/02 257/191 |
| 2011/0147711 A1 * | 6/2011 | Pillarisetty | B82Y 10/00 257/24 |
| 2014/0264600 A1 * | 9/2014 | Adam | H01L 29/66795 257/347 |
| 2014/0285980 A1 * | 9/2014 | Cappellani | H01L 21/76 361/748 |
| 2015/0102385 A1 * | 4/2015 | Fung | H01L 21/02381 257/190 |
| 2015/0357417 A1 * | 12/2015 | Basu | H01L 29/205 257/201 |
| 2015/0380556 A1 * | 12/2015 | Ching | H01L 29/7849 257/351 |

OTHER PUBLICATIONS

Currie, M.T., et al., "Controlling threading dislocation densities in Ge on Si using graded SiGe layers and chemical-mechanical polishing", Applied Physics Letters, vol. 72, No. 14, Apr. 6, 1998, pp. 1718-1720.

Lee, M., et al., "Strained Si, SiGe, and Ge channels for high-mobility metal-oxide-semiconductor field-effect transistors," Journal of Applied Physics 97, 011101, 2005, 27 pages.

* cited by examiner

2a

SEMICONDUCTOR SUBSTRATE AND SEMICONDUCTOR DEVICE INCLUDING THE SAME

CROSS-REFERENCE TO RELATED APPLICATION

This application claims priority from Korean Patent Application No. 10-2015-0011490 filed on Jan. 23, 2015 in the Korean Intellectual Property Office, and all the benefits accruing therefrom under 35 U.S.C. 119, the disclosure of which is incorporated by reference herein in its entirety.

FIELD

The present inventive concepts relate to semiconductor substrates and semiconductor devices including the same.

BACKGROUND

As a feature size of a MOS transistor decreases, a gate length and a length of a channel formed below may also decrease. As the channel length of the transistor decreases, scattering of electric charge may increase in the channel, and mobility of the electric charge may decrease. A decrease in mobility of the electric charge may become a failure in improving the saturation current of the transistor.

Therefore, various research has been conducted to provide semiconductor substrates for improving the mobility of the electric charge in a transistor having a reduced channel length.

SUMMARY

According to some embodiments of the present inventive concepts, a semiconductor device includes a substrate and a strain released layer on the substrate. The strain released layer has a lattice constant that is larger than a lattice constant of a directly underlying layer at an interface therewith. A strain relaxed buffer layer is directly on the strain released layer opposite the underlying layer. The lattice constant of the strain released layer decreases from the interface with the underlying layer to an interface with the strain relaxed buffer layer directly thereon. The strain released layer, the underlying layer, and the strain relaxed buffer layer comprise a same compound semiconductor material.

In some embodiments, the lattice constant of the strain released layer decreases continuously or in a stepwise manner from the interface with the underlying layer to the interface with the strain relaxed buffer layer directly thereon.

In some embodiments, a lattice constant of the strain relaxed buffer layer is substantially uniform over a thickness thereof.

In some embodiments, a lattice constant of the strain relaxed buffer layer at the interface with the strain released layer is larger than, smaller than, or equal to the lattice constant of the underlying layer.

In some embodiments, a lattice constant of the underlying layer and/or the strain relaxed buffer layer increases with distance from the substrate.

In some embodiments, one of the underlying layer and the strain relaxed buffer layer includes a plurality of insulating film patterns therein. A density of dislocations in the one of the underlying layer and the strain relaxed buffer layer is greater in portions thereof closer to the insulating layer patterns than in portions thereof further from the insulating layer patterns.

In some embodiments, the strain released layer may be a first strain released layer. A second strain released layer is provided on the substrate, where the second strain released layer has a lattice constant larger than those of layers directly thereunder and directly thereabove. The second strain released layer may be between the first strain released layer and the substrate, or may be on the strain relaxed buffer layer opposite the first strain released layer.

In some embodiments, the lattice constant of the second strain released layer is substantially uniform between respective interfaces with the layers directly thereunder and directly thereabove.

In some embodiments, the lattice constant of the second strain released layer is larger than that of the layer directly thereunder at an interface therewith, and decreases from the interface with the layer directly thereunder to an interface with the layer directly thereabove.

In some embodiments, the substrate comprises the underlying layer such that the strain released layer is directly on the substrate.

In some embodiments, the compound semiconductor material may comprise a Group IV-VI compound including carbon (C), silicon (Si), germanium (Ge), and/or tin (Sn), or the compound semiconductor material may comprise a Group III-V compound including aluminum (Al), gallium (Ga), indium (In), phosphorus (P) and/or arsenic (As).

In some embodiments, a transistor structure may be provided on the strain relaxed buffer layer opposite the strain released layer. The transistor structure may include a channel layer and a gate electrode disposed on the channel layer. The channel layer may be included in a fin type active pattern comprising the compound semiconductor material, and the gate electrode may intersect with the fin type active pattern. An epitaxial layer may be formed on a sidewall of the fin type active pattern on a side of the gate electrode.

In accordance with an aspect of the present inventive concepts, a semiconductor substrate comprises a base substrate, a first silicon germanium layer on the base substrate and a second silicon germanium layer on the first silicon germanium layer, wherein a germanium fraction of the second silicon germanium layer decreases in the direction away from the base substrate, and a germanium fraction of a lowermost part of the second silicon germanium layer is greater than a germanium fraction of an uppermost part of the first silicon germanium layer.

In accordance with another aspect of the present inventive concepts, a semiconductor substrate comprises a base substrate, a first silicon germanium layer on the base substrate, a second silicon germanium layer on the first silicon germanium layer, a germanium fraction of the second silicon germanium layer decreasing in the direction away from the base substrate and a third silicon germanium layer on the second silicon germanium layer, a germanium fraction of a lowermost part of the third silicon germanium layer being greater than a germanium fraction of an uppermost part of the first silicon germanium layer.

In accordance with still another aspect of the present inventive concepts, a semiconductor substrate comprises a base substrate, a first compound semiconductor layer on the base substrate, a second compound semiconductor layer including the same material as the first compound semiconductor layer on the first compound semiconductor layer, a lattice constant of the second compound semiconductor layer decreasing in the direction away from the base substrate and a third compound semiconductor layer including the same material as the first compound semiconductor layer on the second compound semiconductor layer, a lattice constant of the third compound semiconductor layer being greater than a lattice constant of the first compound semiconductor layer.

In accordance with still another aspect of the present inventive concepts, a semiconductor substrate comprises a base substrate, a first silicon germanium layer on the base substrate, an insulating film pattern above the first silicon germanium layer and a second silicon germanium layer above the insulating film pattern.

In accordance with still another aspect of the present inventive concepts, a semiconductor device comprises a base substrate, a first silicon germanium layer on the base substrate, a second silicon germanium layer on the first silicon germanium layer, a germanium fraction of the second silicon germanium layer decreasing in the direction away from the base substrate, and a germanium fraction of a lowermost part of the second silicon germanium layer being greater than a germanium fraction of an uppermost part of the first silicon germanium layer, and a gate electrode on the second silicon germanium layer.

In accordance with still another aspect of the present inventive concepts, a semiconductor device comprises, a substrate which includes a base layer and a first silicon germanium layer on the base layer, a fin type active pattern which protrudes from the substrate and includes silicon germanium, a part of a side wall of the fin type active patterns being surrounded by a field insulating film, a channel layer on the fin type active pattern, a gate electrode which intersects with the fin type active pattern on the channel layer and an epitaxial layer formed on the side wall of the fin type active pattern on both sides of the gate electrode, wherein a germanium fraction of the first silicon germanium layer decrease in the direction away from the base layer, and a germanium fraction of a lowermost part of the first silicon germanium layer is greater than a germanium fraction of the uppermost part of the base layer.

In accordance with still another aspect of the present inventive concepts, a semiconductor device comprises a substrate which includes a base layer, a first silicon germanium layer, a second silicon germanium layer and a third silicon germanium layer that are sequentially laminated, the third silicon germanium layer including a trench having a depth less than a thickness of the third silicon germanium layer, a field insulating film which fills a part of the trench, an upper surface of the field insulating film being further adjacent to the base layer than the upper surface of the third silicon germanium layer, a channel layer on the third silicon germanium layer and a gate electrode, which intersects with the third silicon germanium layer protruding from the upper surface of the field insulating film, on the channel layer, wherein a germanium fraction of the second silicon germanium layer decreases in the direction away from the base layer, and a germanium fraction of a lowermost part of the second silicon germanium layer is greater than a germanium fraction of an uppermost part of the first silicon germanium layer.

BRIEF DESCRIPTION OF THE DRAWINGS

The above and other aspects and features of the present inventive concepts will become more apparent by describing in detail example embodiments thereof with reference to the attached drawings, in which.

DETAILED DESCRIPTION OF EMBODIMENTS

Figure 1:
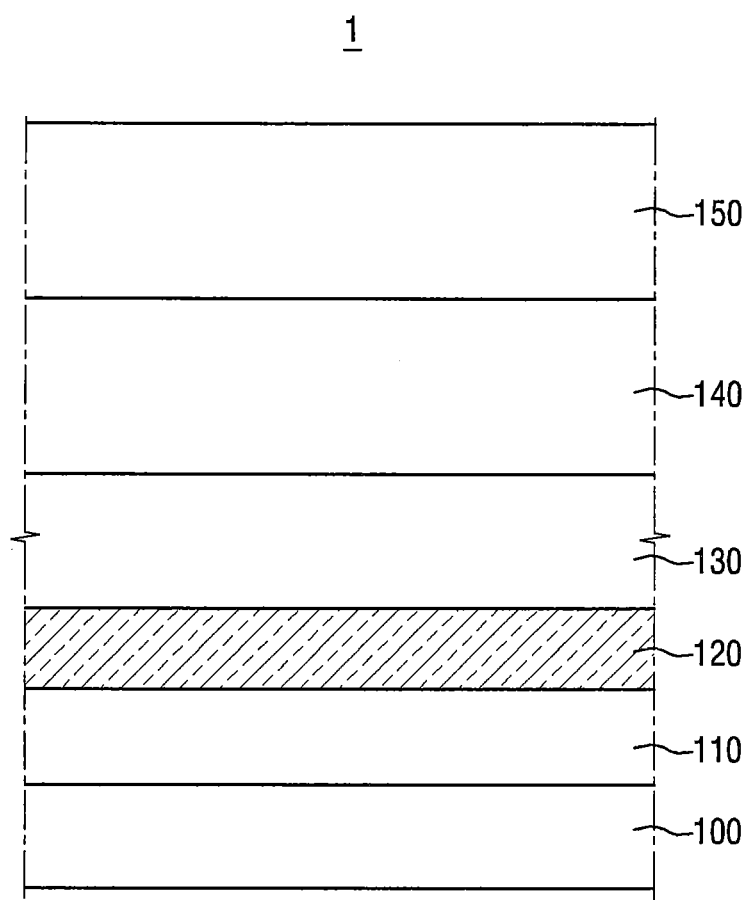
FIG. 1 is a diagram illustrating a semiconductor substrate according to a first embodiment of the present inventive concepts.

Advantages and features of the present inventive concepts and methods of accomplishing the same may be understood more readily by reference to the following detailed description of preferred embodiments and the accompanying drawings. The present inventive concepts may, however, be embodied in many different forms and should not be construed as being limited to the embodiments set forth herein. Rather, these embodiments are provided so that this disclosure will be thorough and complete and will fully convey the concept of the inventive concepts to those skilled in the art, and the present inventive concepts will only be defined by the appended claims. In the drawings, the thickness of layers and regions are exaggerated for clarity.

It will be understood that when an element or layer is referred to as being "on" or "connected to" another element or layer, it may be directly on or connected to the other element or layer, or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements or embodiments, these elements or embodiments should not be limited by these terms. These terms are only used to distinguish one element from another element. Thus, for example, a first element, a first component or a first section discussed below could be termed a second element, a second component or a second section without departing from the teachings of the present inventive concepts.

The present inventive concepts will be described with reference to perspective views, cross-sectional views, and/or plan views, in which idealized embodiments of the inventive concepts are shown. Thus, the profile of an example view may be modified according to manufacturing techniques and/or allowances. That is, embodiments of the inventive concepts are not intended to limit the scope of the present inventive concepts but cover all changes and modifications that may be caused due to a change in manufacturing process. Thus, regions shown in the drawings are illustrated in schematic form and the shapes of the regions are presented simply by way of illustration and not as a limitation.

Unless defined otherwise, all technical and scientific terms used herein have the same meaning as commonly understood by one of ordinary skill in the art to which these inventive concepts belong. It is noted that the use of any and all examples, or example terms provided herein is intended merely to better illuminate the inventive concepts and is not a limitation on the scope of the inventive concepts unless otherwise specified. Further, unless defined otherwise, all terms defined in generally used dictionaries may not be overly interpreted.

Figure 2:
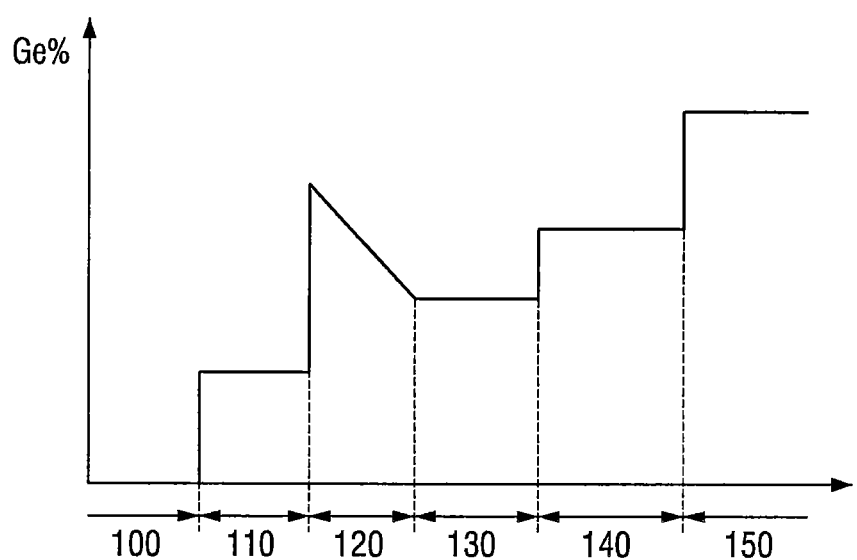
FIG. 2 is a schematic graph illustrating a germanium fraction of each layer included in the semiconductor substrate of FIG. 1.

FIG. 1 is a diagram illustrating a semiconductor substrate according to a first embodiment of the present inventive concepts. FIG. 2 is a schematic graph illustrating a germanium fraction of each layer included in the semiconductor substrate of FIG. 1.

Referring to FIGS. 1 and 2, a semiconductor substrate 1 according to a first embodiment of the present inventive concepts may include a base substrate 100, a first strain relaxed buffer layer 110, a second strain relaxed layer buffer 130, a third strain relaxed buffer layer 140, a first strain released layer 120 and the like.

The base substrate 100 may include, but not limited to, bulk silicon, a SOI (silicon-on-insulator), a silicon substrate, silicon germanium, a SGOI (Silicon germanium-on-Insulator), silicon carbide, indium antimonide, lead telluride, indium arsenide, indium phosphide, gallium arsenide or gallium antimonide.

In the description according to some embodiments of the present inventive concepts, the base substrate 100 is described as being a silicon substrate which includes silicon. The first strain relaxed buffer layer 110 is formed on the base substrate 100. The first strain relaxed buffer layer 110 may include a compound semiconductor. The first strain relaxed buffer layer 110 may include, for example, a group IV-IV compound semiconductor or a group III-V compound semiconductor. Specifically, when taking the group IV-IV compound semiconductor as an example, the first strain relaxed buffer layer 110 may be binary compounds, ternary compounds such as silicon germanium containing at least two or more of carbon (C), silicon (Si), germanium (Ge) and tin (Sn), or a compound in which these compounds are doped with the group IV element. When taking the group III-V compound semiconductor as an example, the first strain relaxed buffer layer 110 may be one of the binary compounds, the ternary compounds or the quaternary compounds which are formed by binding at least one of aluminum (Al), gallium (Ga) and indium (In) as a group III element with one of phosphorus (P) and arsenic (As) a group V element.

The first strain relaxed buffer layer 110 may be formed on the base substrate 100 by an epitaxial growth method. For example, the first strain relaxed buffer layer 110 may be formed using, but not limited to, methods such as APCVD (Atmospheric Pressure Chemical Vapor Deposition), LPCVD (Low (or reduced) Pressure Chemical Vapor Deposition), UHV-CVD (Ultra High Vacuum Chemical Vapor Deposition), MBE (Molecular Beam Epitaxy) and MOCVD (Metal Organic Chemical Vapor Deposition).

The first strain relaxed buffer layer 110 may have a crystal structure similar to the base substrate 100. In semiconductor substrates according to some embodiments of the present inventive concepts, a silicon substrate used for the base substrate 100 has a diamond crystal structure. Therefore, the first strain relaxed buffer layer 110 including the compound semiconductor may have a zincblende structure similar to the diamond crystal structure.

In semiconductor substrates according to some embodiments of the present inventive concepts, the first strain relaxed buffer layer 110 is described as being a silicon germanium layer.

The first strain relaxed buffer layer 110 may include, for example, a $Si_{1-x}Ge_x$. Here, x may be greater than 0 and smaller than 1. The germanium fraction of the first strain relaxed buffer layer 110 may be greater than the germanium fraction of the lower base substrate 100.

In semiconductor substrates according to the first embodiment of the present inventive concepts, the first strain relaxed buffer layer 110 may have a uniform germanium fraction in the thickness direction of the first strain relaxed buffer layer 110, i.e., in the thickness direction of the base substrate 100.

Since the base substrate 100 includes silicon and the first strain relaxed buffer layer 110 includes silicon germanium, a lattice constant of the first strain relaxed buffer layer 110 may be generally greater than a lattice constant of the base substrate 100.

In the description according to some embodiments of the present inventive concepts, the germanium fraction of the base substrate 100 is described as being substantially zero. Here, the expression "the germanium fraction is 0" means that a thin film including the intentionally grown germanium is not included in the base substrate 100.

For example, germanium entering onto the base substrate 100 by being diffused from the thin film containing germanium may be included in the base substrate 100. That is, the base substrate 100 having a germanium concentration or fraction of substantially zero may nevertheless include germanium entering onto the base substrate 100 by being diffused from the thin film containing germanium.

Otherwise, or in addition, there may be impurities which are contained for thermodynamic stability in the course of manufacturing the base substrate 100. As such, germanium may also be contained in the impurities contained in the base substrate 100.

The first strain released layer 120 may be formed on the first strain relaxed buffer layer 110. For example, the first strain released layer 120 may be formed above the first strain relaxed buffer layer 110. That is, a lowermost part of the first strain released layer 120 may be in contact with an uppermost part of the first strain relaxed buffer layer 110.

The first strain released layer 120 may include a compound semiconductor. The first strain released layer 120 may include, for example, the same material as the first strain relaxed buffer layer 110. That is, the first strain released layer 120 may be a silicon germanium layer including silicon germanium.

The first strain released layer 120 may be formed on the first strain relaxed buffer layer 110 by an epitaxial growth method.

The first strain released layer 120 may include, for example, $Si_{1-a}Ge_a$. Here, a may be greater than 0 and smaller than 1. The germanium fraction of the first strain released layer 120 may vary along the thickness direction of the first strain released layer 120. That is, the value of a may vary along the thickness direction of the first strain released layer 120.

In semiconductor substrates according to some embodiments of the present inventive concepts, the germanium fraction of the first strain released layer 120 may decrease in a direction away or with distance from the base substrate 100. That is, the germanium fraction of the first strain released layer 120 at a portion nearest to the first strain relaxed buffer layer 110 may be greater than the germanium fraction of the first strain released layer 120 at a portion farthest from the first strain relaxed buffer layer 110.

In addition, in semiconductor substrates according to the first embodiment of the present inventive concepts, the germanium fraction of the first strain released layer 120 may continuously decrease (for example, linearly) in a direction away or with distance from the base substrate 100.

The germanium fraction of the first strain released layer 120, which continuously decreases in a direction away or with distance from the base substrate 100, may be obtained, for example, by changing, but not limited to, a temperature during the epitaxial growth, a ratio between the source gases, a pressure or the like.

Since the germanium fraction of the first strain released layer 120 decreases in a direction away or with distance from the base substrate 100, the lattice constant of the first strain released layer 120 may decrease in a direction away or with distance from the base substrate 100.

Furthermore, in semiconductor substrates according to some embodiments of the present inventive concepts, the germanium fraction of the lowermost part of the first strain released layer 120 may be greater than the germanium fraction of the uppermost part of the first strain relaxed buffer layer 110. Although FIG. 2 illustrates that the germanium fraction increases at a time or interface between the uppermost part of the first strain relaxed buffer layer 110 and the lowermost part of the first strain released layer 120, it is intended only for the convenience of explanation, but embodiments of the present inventive concept are not limited thereto.

That is, by an occurrence of intermixing such as diffusion between the first strain relaxed buffer layer 110 and the first strain released layer 120, there may be, of course, fluctuations of the germanium fraction between the first strain relaxed buffer layer 110 and the first strain released layer 120.

A second strain relaxed buffer layer 130 may be formed on the first strain released layer 120. For example, the second strain relaxed buffer layer 130 may be formed above the first strain released layer 120. That is, the lowermost part of the second strain relaxed buffer layer 130 may be in contact with the uppermost part of the first strain released layer 120.

The second strain relaxed buffer layer 130 may include a compound semiconductor. The second strain relaxed buffer layer 130 may include, for example, the same material as that of the first strain relaxed buffer layer 110. That is, the second strain relaxed buffer layer 130 may be a silicon germanium layer including silicon germanium.

The second strain relaxed buffer layer 130 may be formed on the first strain released layer 120 by an epitaxial growth method.

The second strain relaxed buffer layer 130 may include, for example, $Si_{1-y}Ge_y$. Here, y may be greater than 0 and smaller than 1. In semiconductor substrates according to the first embodiment of the present inventive concepts, the second strain relaxed buffer layer 130 may have a uniform germanium fraction in the thickness direction of the second strain relaxed buffer layer 130, i.e., in the thickness direction of the base substrate 100.

Moreover, in semiconductor substrates according to the first embodiment of the present inventive concepts, the germanium fraction of the lowermost part of the second strain relaxed buffer layer 130 may be greater than the germanium fraction of the uppermost part of the first strain relaxed buffer layer 110.

That is, since each of the first strain relaxed buffer layer 110 and the second strain relaxed buffer layer 130 may have a uniform germanium fraction in the thickness direction of the base substrate 100, the germanium fraction of the second strain relaxed buffer layer 130 may be greater than the germanium fraction of the first strain relaxed buffer layer 110. That is, y may be greater than x.

Although each of the first strain relaxed buffer layer 110 and the second strain relaxed buffer layer 130 includes silicon germanium, since the germanium fraction of the second strain relaxed buffer layer 130 is greater than the germanium fraction of the first strain relaxed buffer layer 110, the lattice constant of the second strain relaxed buffer layer 130 may be generally greater than the lattice constant of the first strain relaxed buffer layer 110.

In FIG. 2, the germanium fraction of the lowermost part of the second strain relaxed buffer layer 130 are illustrated as being substantially the same as the germanium fraction of the first strain released layer 120, but it is not limited thereto.

That is, the germanium fraction of the lowermost part of the second strain relaxed buffer layer 130 may be of course greater or smaller than the germanium fraction of the uppermost part of the first strain released layer 120.

A third strain relaxed buffer layer 140 may be formed on the second strain relaxed buffer layer 130. The third strain relaxed buffer layer 140 may include a compound semiconductor.

The third strain relaxed buffer layer 140 may include, for example, the same material as that of the first strain relaxed buffer layer 110. That is, the third strain relaxed buffer layer 140 may be a silicon germanium layer including silicon germanium.

The third strain relaxed buffer layer 140 may be formed on the second strain relaxed buffer layer 130 by an epitaxial growth method.

The third strain relaxed buffer layer 140 may include, for example, $Si_{1-z}Ge_z$. Here, z may be greater than 0 and smaller than 1. In FIG. 2, the third strain relaxed buffer layer 140 may have a uniform germanium fraction in the thickness direction of the third strain relaxed buffer layer 140, that is, in the thickness direction of the base substrate 100, but embodiments of the present inventive concepts are not limited thereto.

Also, the germanium fraction of the lowermost part of the third strain relaxed buffer layer 140 may be greater than the germanium fraction of the uppermost part of the second strain relaxed buffer layer 130. In other words, since each of the second strain relaxed buffer layer 130 and the third strain relaxed buffer layer 140 may have a uniform germanium ratio in the thickness direction of the base substrate 100, the germanium fraction of the third strain relaxed buffer layer 140 may be greater than the germanium fraction of the second strain relaxed buffer layer 130. That is, z may be greater than y.

Although each of the second strain relaxed buffer layer 130 and the third strain relaxed buffer layer 140 includes silicon germanium, since the germanium fraction of the third strain relaxed buffer layer 140 is greater than the germanium fraction of the second strain relaxed buffer layer 130, the lattice constant of the third strain relaxed buffer layer 140 may be generally greater than the lattice constant of the second strain relaxed buffer layer 130.

A fourth strain relaxed buffer layer 150 may be formed on the third strain relaxed buffer layer 140. The fourth strain relaxed buffer layer 150 may include a compound semiconductor.

The fourth strain relaxed buffer layer 150 may include, for example, the same material as that of the first strain relaxed buffer layer 110. That is, the fourth strain relaxed buffer layer 150 may be a silicon germanium layer including silicon germanium.

The fourth strain relaxed buffer layer 150 may be formed on the third strain relaxed buffer layer 140 by an epitaxial growth method.

The fourth strain relaxed buffer layer 150 may include, for example, $Si_{1-w}Ge_w$. Here, w may be greater than 0 and smaller than 1. In FIG. 2, the fourth strain relaxed buffer layer 150 may have a uniform germanium ratio in the thickness direction of the fourth strain relaxed buffer layer 150, that is, in the thickness direction of the base substrate 100, but embodiments of the present inventive concepts are not limited thereto.

Also, the germanium fraction of the lowermost part of the fourth strain relaxed buffer layer 150 may be greater than the germanium fraction of the uppermost part of the third strain relaxed buffer layer 140. In other words, since each of the third strain relaxed buffer layer 140 and the fourth strain relaxed buffer layer 150 may have a uniform germanium fraction in the thickness direction of the base substrate 100, the germanium fraction of the fourth strain relaxed buffer layer 150 may be greater than the germanium fraction of the third strain relaxed buffer layer 140. That is, w may be greater than z.

Although each of the third strain relaxed buffer layer 140 and the fourth strain relaxed buffer layer 150 includes silicon germanium, since the germanium fraction of the fourth strain relaxed buffer layer 150 is greater than the germanium fraction of the third strain relaxed buffer layer 140, the lattice constant of the fourth strain relaxed buffer layer 150 may be generally greater than the lattice constant of the third strain relaxed buffer layer 140.

In the semiconductor substrate 1 according to the first embodiment of the present inventive concepts, the germanium fraction of the first strain relaxed buffer layer 110, the germanium fraction of the second strain relaxed buffer layer 130, the germanium fraction of the third strain relaxed buffer layer 140 and the germanium fraction of the fourth strain relaxed buffer layer 150 may increase as they are at an increasing distance away from the base substrate 100.

In the description of FIGS. 1 and 2, the semiconductor substrate 1 according to the first embodiment of the present inventive concepts has been described as including the third strain relaxed buffer layer 140 and the fourth strain relaxed buffer layer 150, but embodiments of the present inventive concepts are not limited thereto.

That is, the semiconductor substrate 1 according to the first embodiment of the present inventive concepts may be in a state in which the fourth strain relaxed buffer layer 150 or the third strain relaxed buffer layer 140 and the fourth strain relaxed buffer layer 150 are removed or are otherwise not included or formed.

The effects of the first strain released layer 120 included in the semiconductor substrate will be described below. For convenience of explanation, a stress relaxed buffer layer for relaxation of strain will be described using only the first strain relaxed buffer layer 110 and the second strain relaxed buffer layer 130.

The first strain relaxed buffer layer 110 including a material having a lattice constant different from the base substrate 100 may be grown on the base substrate 100. When the first strain relaxed buffer layer 110 is thinner than a critical thickness, the first strain relaxed buffer layer 110 may be in a state of being fully strained.

Meanwhile, when the thickness of the first strain relaxed buffer layer 110 becomes greater than the critical thickness, it is possible to reduce the internal energy of the first strain relaxed buffer layer 110, while generating a dislocation by the first strain relaxed buffer layer 110. However, the dislocation generated in the first strain relaxed buffer layer 110 may be transmitted inside the first strain relaxed buffer layer 110 and may be extended to the uppermost surface of the first strain relaxed buffer layer 110.

When forming the second strain relaxed buffer layer 130 on the first strain relaxed buffer layer 110 in this state, the dislocation generated inside the first strain relaxed buffer layer 110 may be extended and transmitted to the interior of the second strain relaxed buffer layer 130, and in addition to this, an additional dislocation may be generated due to a difference in lattice constants between the first strain relaxed buffer layer 110 and the second strain relaxed buffer layer 130.

Therefore, even if the strain of the second strain relaxed buffer layer 130 is released by growing the first strain relaxed buffer layer 110 and the second strain relaxed buffer layer 130 on the base substrate 100, the second strain relaxed buffer layer 130 may include dislocations. Thus, even if a channel layer for the semiconductor device is additionally grown on the second strain relaxed buffer layer 130, performance of the semiconductor device may be degraded because of the dislocations of the second strain relaxed buffer layer 130 located below the channel layer.

However, when the first strain released layer 120 of the present inventive concepts is inserted between the first strain relaxed buffer layer 110 and the second strain relaxed buffer layer 130, a tensile stress rather than a compressive stress (when the second strain relaxed buffer layer 130 is formed) is applied to the top of the first strain relaxed buffer layer 110 by the first strain released layer 120. That is, as a sign of the strain field changes between the first strain relaxed buffer layer 110 and the first strain released layer 120, it is possible to reduce the density of the dislocation transmitted from the first strain relaxed buffer layer 110.

Since the first strain released layer 120 has the germanium fraction higher than those of the first strain relaxed buffer layer 110 and the second strain relaxed buffer layer 130, the first strain released layer 120 may apply the tensile stress to the second strain relaxed buffer layer 130. Thus, the first strain released layer 120 may provide a help so that the top of the second strain relaxed buffer layer 130 may be fully released or substantially released. Here, the fully released second strain relaxed buffer layer 130 means a silicon germanium layer having a lattice constant that is proportional to the germanium fraction and the silicon fraction included in the second strain relaxed buffer layer 130 at least at the interface therebetween.

In addition, the first strain released layer 120 may promote to fully release or substantially release the top of the second strain relaxed buffer layer 130. However, when a plurality of strain relaxed buffer layers, in which the germanium fraction sequentially increases, is formed on the base substrate 100, the top of the strain relaxed buffer layer may be completely released by growing the thick strain relaxed buffer layer.

Thus, even if an epitaxial layer thinner than (b) the strain relaxed buffer layer which does not include the first strain relaxed buffer layer 110 is formed on the based substrate 100, (a) the strain relaxed buffer layer including the first strain released layer 120 may obtain the same or further improved strain release and dislocation density as those of (b).

In semiconductor substrates according to the first embodiment of the present inventive concepts, the first to fourth strain relaxed buffer layers 110, 130, 140, 150 and the first strain released layer 120 have been described as including silicon germanium.

As another example, a case in which the first to fourth strain relaxed buffer layers 110, 130, 140, 150 and the first strain released layer 120 include the different materials other than silicon germanium will be briefly described below.

Hereinafter, the first to fourth strain relaxed buffer layers 110, 130, 140, 150 and the first strain released layer 120 will be described as including, for example, a group III-V compound semiconductor, such as $In_pGa_{(1-p)}As$ of the group III-V compound semiconductor. Here, p may be 0 or more and 1 or less. The indium fraction of the second strain relaxed buffer layer 130 may be greater than the indium fraction in the first strain relaxed buffer layer 110. Furthermore, the indium fraction of the third strain relaxed buffer layer 140 may be greater than the indium fraction of the second strain relaxed buffer layer 130 and may be smaller than the indium fraction of the fourth strain relaxed buffer layer 150.

The indium fraction of the first strain released layer 120 may vary along the thickness direction of the first strain released layer 120. That is, the p value may vary along the thickness direction of the first strain released layer 120.

For example, the indium fraction of the first strain released layer 120 may decrease in a direction away or with distance from the base substrate 100. The indium fraction of the first strain released layer 120 in the portion nearest to the first strain relaxed buffer layer 110 may be greater than the indium fraction of the first strain released layer 120 in the portion farthest from the first strain relaxed buffer layer 110.

In addition, the indium fraction of the first strain released layer 120 may continuously decrease or decrease in a stepwise manner in a direction away or with distance from the base substrate 100.

In the above description, it has been illustrated that the lattice constants of the strain relaxed buffer layers 110, 130, 140, 150 increase as moving from the first strain relaxed buffer layer 110 to the fourth strain relaxed buffer layer 150. However, unlike this, when moving from the first strain relaxed buffer layer 110 to the fourth strain relaxed buffer layer 150, the lattice constants of the strain relaxed buffer layers 110, 130, 140, 150 may decrease.

That is, a gallium fraction of the second strain relaxed buffer layer 130 may be greater than a gallium fraction in the first strain relaxed buffer layer 110. Further, a gallium fraction of the third strain relaxed buffer layer 140 may be greater than a gallium fraction of the second strain relaxed buffer layer 130 and may be smaller than a gallium fraction of the fourth strain relaxed buffer layer 150.

In addition, the first to fourth strain relaxed buffer layers 110, 130, 140, 150 and the first strain released layer 120 may include different materials rather than the same material.

Figure 3A:
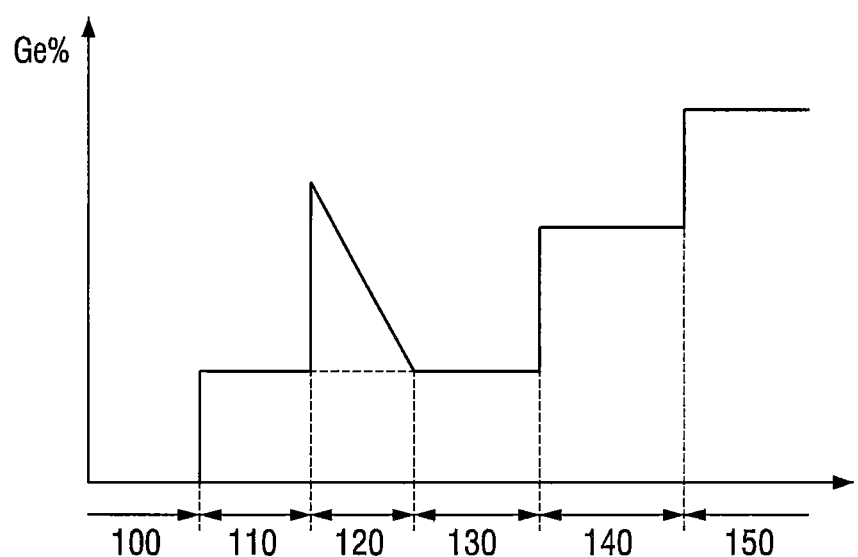
FIG. 3a is a schematic graph illustrating a germanium fraction of each layer included in a semiconductor substrate according to a second embodiment of the present inventive concepts.
Figure 3B:
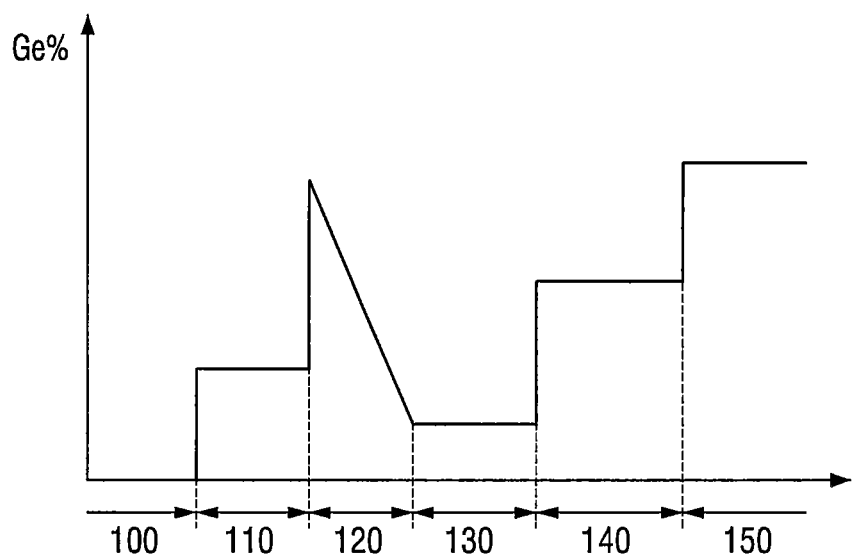
FIG. 3b is a schematic graph illustrating a germanium fraction of each layer included in a semiconductor substrate according to a modified example of the second embodiment of the present inventive concepts.
Figure 4:
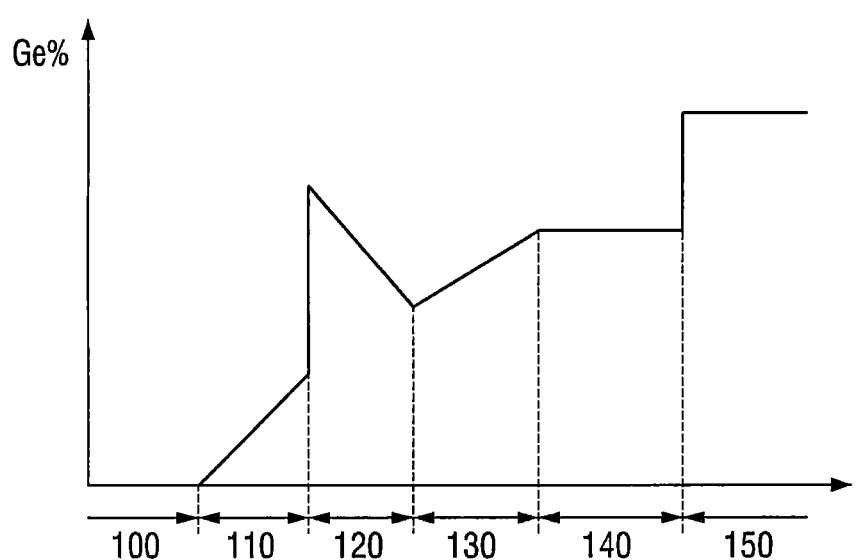
FIG. 4 is a schematic graph illustrating a germanium fraction of each layer included in a semiconductor substrate according to a third embodiment of the present inventive concepts.
Figure 5:
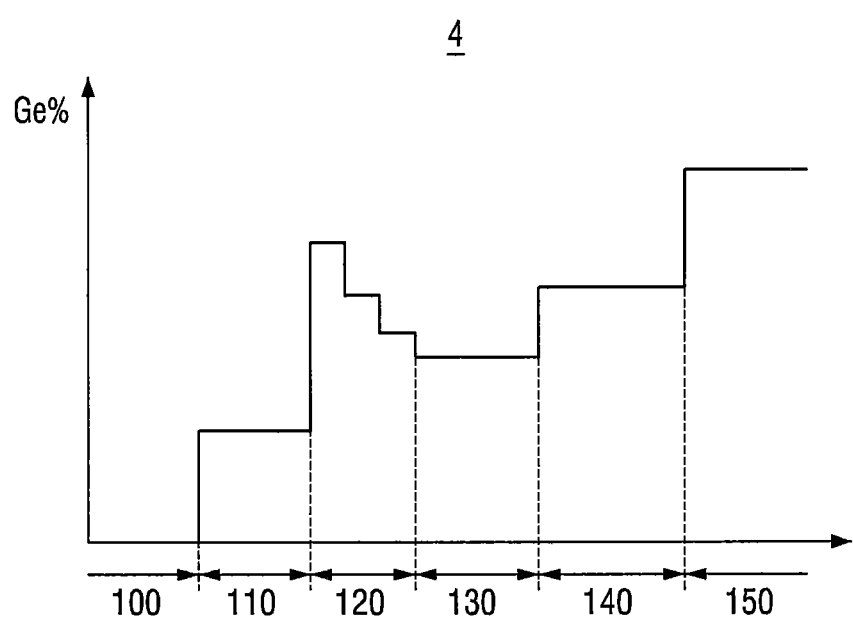
FIG. 5 is a schematic graph illustrating a germanium fraction of each layer included in a semiconductor substrate according to a fourth embodiment of the present inventive concepts.

FIG. 3a is a schematic graph illustrating a germanium fraction of each layer included in a semiconductor substrate according to a second embodiment of the present inventive concepts. FIG. 3b is a schematic graph illustrating a germanium fraction of each layer included in a semiconductor substrate according to a modified example of the second embodiment of the present inventive concepts. FIG. 4 is a schematic graph illustrating a germanium fraction of each layer included in a semiconductor substrate according to a third embodiment of the present inventive concepts. FIG. 5 is a schematic graph illustrating a germanium fraction of each layer included in a semiconductor substrate according to a fourth embodiment of the present inventive concepts. For convenience of explanation, differences from those described with reference to FIGS. 1 and 2 will be mainly described.

Referring to FIG. 3a, in the semiconductor substrate 2 according to the second embodiment of the present inventive concepts, a germanium fraction of a lowermost part of the second strain relaxed buffer layer 130 may be substantially the same as the germanium fraction of the uppermost part of the first strain relaxed buffer layer 110. In other words, since each of the first strain relaxed buffer layer 110 and the second strain relaxed buffer layer 130 may have a uniform germanium fraction in the thickness direction of the base substrate 100, the germanium fraction of the second strain relaxed buffer layer 130 may be the same as the germanium fraction of the first strain relaxed buffer layer 110. That is, y may have substantially the same value as that of x.

The first strain released layer 120 may be disposed between the first strain relaxed buffer layer 110 and the second strain relaxed buffer layer 130 having the same germanium fraction each other. Since the first strain released layer 120 varies the strain field in each boundary surface between the first strain relaxed buffer layer 110 and the second strain relaxed buffer layer 130, it is possible to reduce the strain release from the top of the second strain relaxed buffer layer 130 and the density of dislocation transmitted by being extended from the first strain relaxed buffer layer 110 to the second strain relaxed buffer layer 130.

Referring to FIG. 3b, in the semiconductor substrate 2a according to a modified example of the second embodiment of the present inventive concepts, a germanium fraction of the lowermost part of the second strain relaxed buffer layer 130 may be smaller than the germanium fraction of the uppermost part of first strain relaxed buffer layer 110. That is, the germanium fraction of the second strain relaxed buffer layer 130 may be smaller than the germanium fraction of the first strain relaxed buffer layer 110. That is, y may be smaller than x.

Referring to FIG. 4, in a semiconductor substrate 3 according to a third embodiment of the present inventive concepts, the germanium fraction of the first strain relaxed buffer layer 110 may increase in a direction away or with distance from the base substrate 100. That is, the germanium fraction of the first strain relaxed buffer layer 110 in a portion nearest to the base substrate 100 may be smaller than the germanium fraction of the first strain relaxed buffer layer 110 in a portion farthest from the base substrate 100. For example, the germanium fraction of the first strain relaxed buffer layer 110 may continuously increase in a direction away or with distance from the base substrate 100. Since the germanium fraction of the first strain relaxed buffer layer 110 increases in a direction away or with distance from the base substrate 100, the lattice constant of the first strain relaxed buffer layer 110 may increase in a direction away or with distance from the base substrate 100.

Also, the germanium fraction of the second strain relaxed buffer layer 130 may increase in a direction away or with distance from the first strain released layer 120. In other words, the germanium fraction of the second strain relaxed buffer layer 130 in the portion nearest to the first strain released layer 120 may be smaller than the germanium fraction of the second strain relaxed buffer layer 130 in the portion furthest from the first strain released layer 120. For example, the germanium fraction of the second strain relaxed buffer layer 130 may continuously increase in a direction away or with distance from the first strain released layer 120. Since the germanium fraction of the second strain relaxed buffer layer 130 increases in a direction away or with distance from the first strain released layer 120, the lattice constant of the second strain relaxed buffer layer 130 may increase in a direction away or with distance from the base substrate 100.

In FIG. 4, each of the third strain relaxed buffer layer 140 and the fourth strain relaxed buffer layer 150 has been illustrated as having a uniform germanium fraction in the thickness direction, but embodiments of the present inventive concepts are not limited thereto.

Also, unlike FIG. 4, the germanium fraction of only one of the first strain relaxed buffer layer 110 and the second strain relaxed buffer layer 130 may increase in a direction away or with distance from the base substrate 100 in some embodiments.

Referring to FIG. 5, in a semiconductor substrate 4 according to a fourth embodiment of the present inventive concepts, the germanium fraction of the first strain released layer 120 may be reduced in a stepwise manner or fashion in a direction away or with distance from the base substrate 100. In other words, the first strain released layer 120 may include a plurality of silicon germanium strain released layers having germanium fractions different from each other. Thus, the silicon germanium strain released layer nearest to the first strain relaxed buffer layer 110 may have a greater germanium fraction than the silicon germanium strain released layer furthest from the first strain relaxed buffer layer 110.

In FIG. 5, although the first strain released layer 120 has been described as including three silicon germanium released layers having the germanium fractions different from one another, this is merely for convenience of explanation and embodiments of the present inventive concepts are not limited thereto. Also, the stepped shape illustrated in FIG. 5 is only for the purpose of description and embodiments of the present inventive concepts are not limited thereto.

Figure 6:
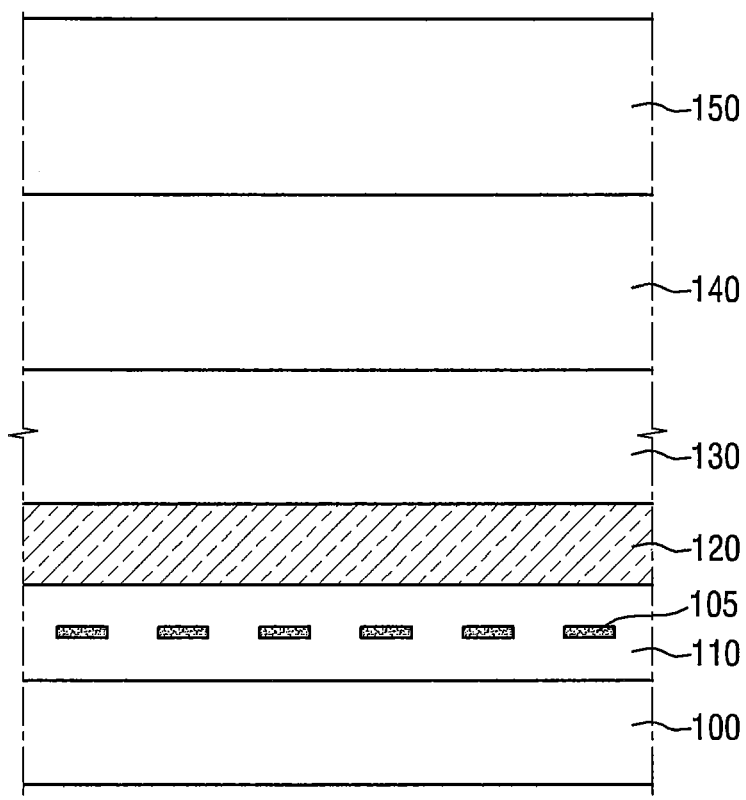
FIG. 6 is a diagram illustrating a semiconductor substrate according to a fifth embodiment of the present inventive concepts.
Figure 7:
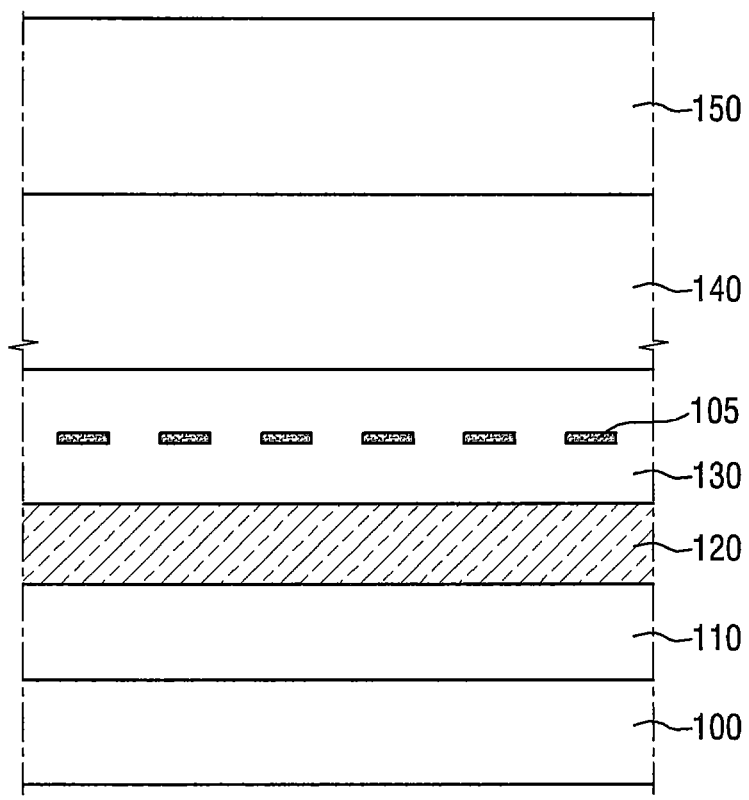
FIG. 7 is a diagram illustrating a semiconductor substrate according to a sixth embodiment of the present inventive concepts.
Figure 8:
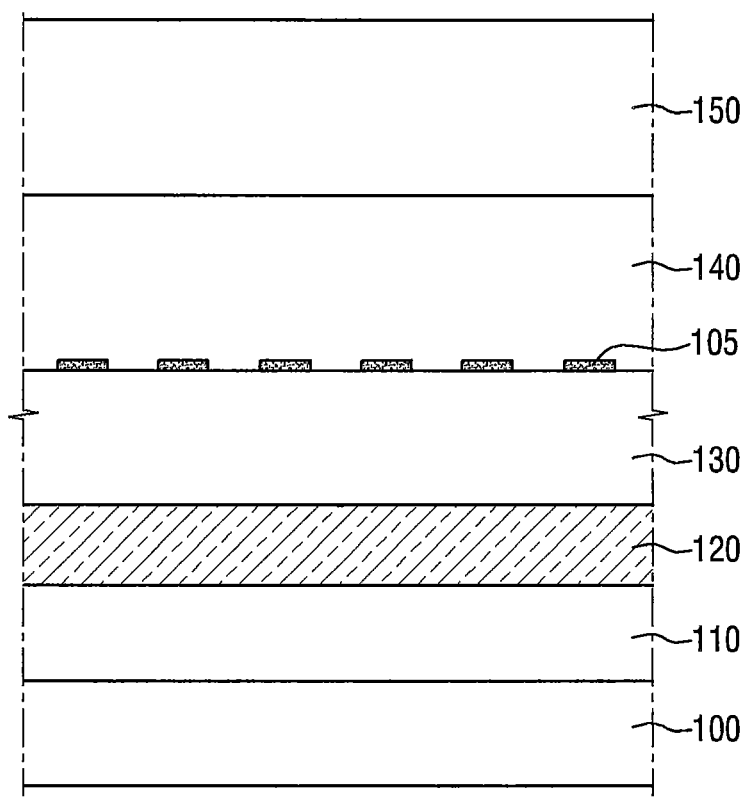
FIG. 8 is a diagram illustrating a semiconductor substrate according to a seventh embodiment of the present inventive concepts.

FIG. 6 is a diagram illustrating a semiconductor substrate according to a fifth embodiment of the present inventive concepts. FIG. 7 is a diagram illustrating a semiconductor substrate according to a sixth embodiment of the present inventive concepts. FIG. 8 is a diagram illustrating a semiconductor substrate according to a seventh embodiment of the present inventive concepts. For reference, the germanium fraction of each layer included in semiconductor substrates according to the fifth to seventh embodiments of the present inventive concepts may be substantially the same as that of FIG. 1.

Referring to FIG. 6, the semiconductor substrate 5 according to a fifth embodiment of the present inventive concepts may further include an insulating film pattern 105 disposed within the first strain relaxed buffer layer 110. The insulating film pattern 105 may be formed within the first strain relaxed buffer layer 110 having the same germanium fraction. The insulating film pattern 105 may include, for example, but not limited to, silicon oxide, silicon oxynitride, silicon nitride or the like.

In FIG. 6, the insulating film patterns 105 have been illustrated as being formed at regular intervals, but embodiments of the present inventive concepts are not limited thereto. Also, each of the insulating film patterns 105 has been illustrated as having a uniform thickness, but embodiments of the present inventive concepts are not limited thereto. As an example, the insulating film pattern 105 may be formed using a patterning process, after forming the first strain relaxed buffer layer 110 located below the insulating film pattern 105. As another example, the insulating film pattern 105 may form a thin insulating film, after forming a part of the first strain relaxed buffer layer 110. After forming the insulating film, by heat-treating the insulating films to cause the insulating films to spontaneously agglomerate, for example, the insulating film pattern 105 having a quantum dot-like shape may be formed.

Since the insulating film pattern 105 is located below the first strain released layer 120, the insulating film pattern 105 may block a part of the dislocation that is transmitted to the top of the first strain relaxed buffer layer 110 from the bottom of the first strain relaxed buffer layer 110. In addition, after forming the insulating film pattern 105, the first strain relaxed buffer layer 110 on the insulating film pattern 105 overlapping the insulating film pattern 105 may be formed through the lateral growth. Therefore, on the basis of the base substrate 100, the density of the dislocation in the first strain relaxed buffer layer 110 located further from the insulating film pattern 105 may be lower than the density of the dislocation in the first strain relaxed buffer layer 110 located nearer to the insulating film pattern 105.

If an additional strain relaxed buffer layer is inserted or otherwise provided between the base substrate 100 and the first strain relaxed buffer layer 110, the insulating film pattern 105 may be formed within the strain relaxed buffer layer interposed between the base substrate 100 and the first strain relaxed buffer layer 110.

Referring to FIG. 7, a semiconductor substrate 6 according to a sixth embodiment of the present inventive concepts may further include an insulating film pattern 105 disposed within the third strain relaxed buffer layer 140. Since the insulating film pattern 105 is located above the first strain released layer 120, the insulating film pattern 105 may block a part of the dislocation that is transmitted to the top of the second strain relaxed buffer layer 130 from the bottom of the second strain relaxed buffer layer 130. Since other descriptions of the insulating film pattern 105 may be substantially the same as the contents described with reference to FIG. 6, those will not be provided below.

Referring to FIG. 8, a semiconductor substrate 7 according to a seventh embodiment of the present inventive concepts may further include an insulating film pattern 105 that is disposed between the second strain relaxed buffer layer 130 and the third strain relaxed buffer layer 140. The insulating film pattern 105 may be formed between the second strain relaxed buffer layer 130 and the third strain relaxed buffer layer 140 having the germanium fractions different from each other.

In FIG. 8, the insulating film pattern 105 has been illustrated as being located on the first strain released layer 120, but embodiments of the present inventive concepts are not limited thereto. That is, the insulating film pattern 105 may be formed between the strain relaxed buffer layers having the germanium fractions different from each other located below the first strain released layer 120 in some, embodiments.

The insulating film pattern 105 according to the seventh embodiment of the present inventive concepts may reduce or prevent a part of the dislocation transmitted from the interior of the second strain relaxed buffer layer 130 from being transmitted to the third strain relaxed buffer layer 140. In addition, the insulating film pattern 105 may reduce an area of a nucleation site of the dislocation that may be generated between the second strain relaxed buffer layer 130 and the third strain relaxed buffer layer 140 having the germanium fractions different from each other. This makes it possible to reduce the density of the dislocation generated between the second strain relaxed buffer layer 130 and the third strain relaxed buffer layer 140 having the germanium fractions different from each other.

Figure 9:
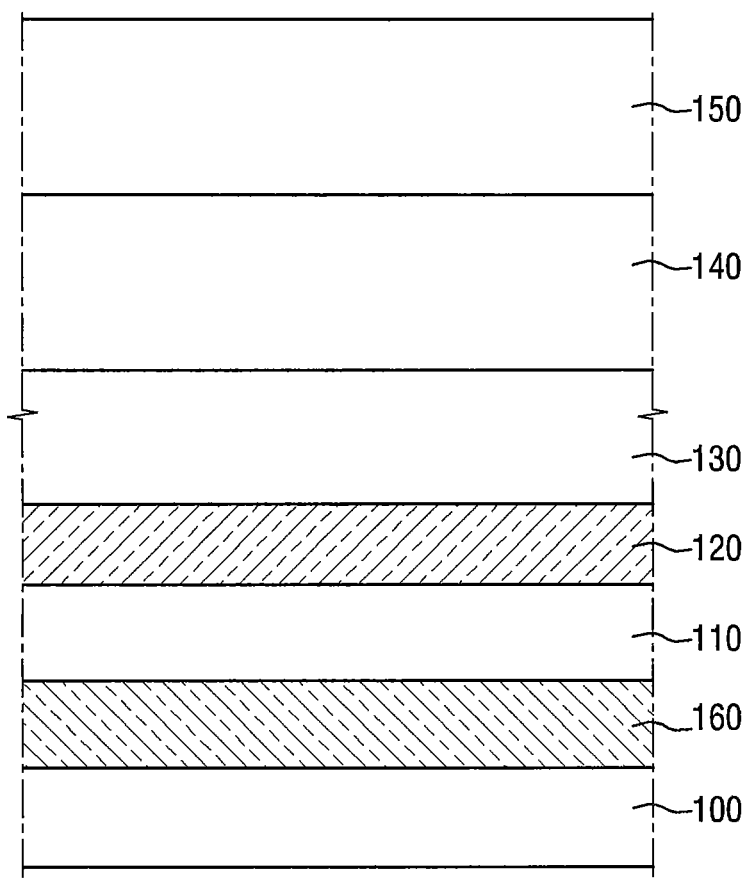
FIG. 9 is a diagram illustrating a semiconductor substrate according to an eighth embodiment of the present inventive concepts.
Figure 10:
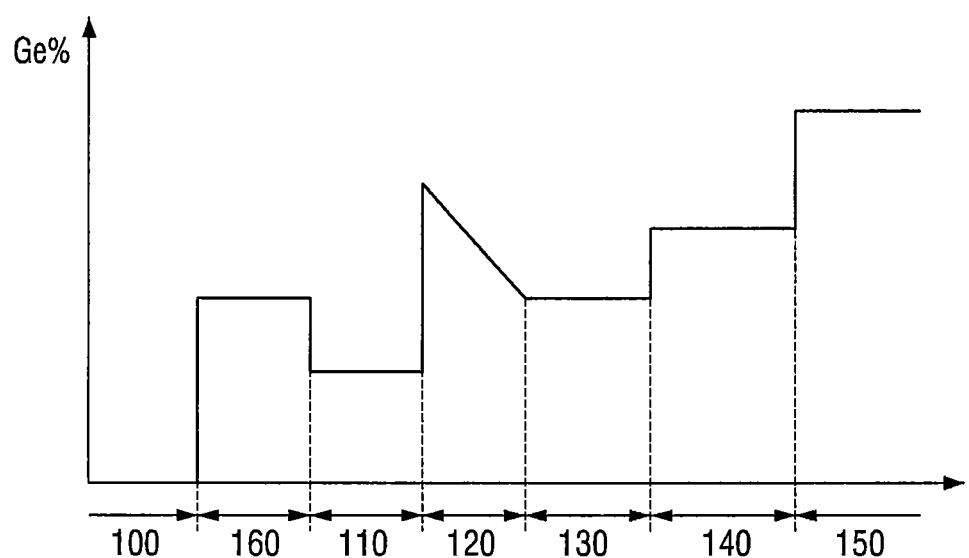
FIG. 10 is a schematic graph illustrating a germanium fraction of each layer included in the semiconductor substrate of FIG. 9.
Figure 11:
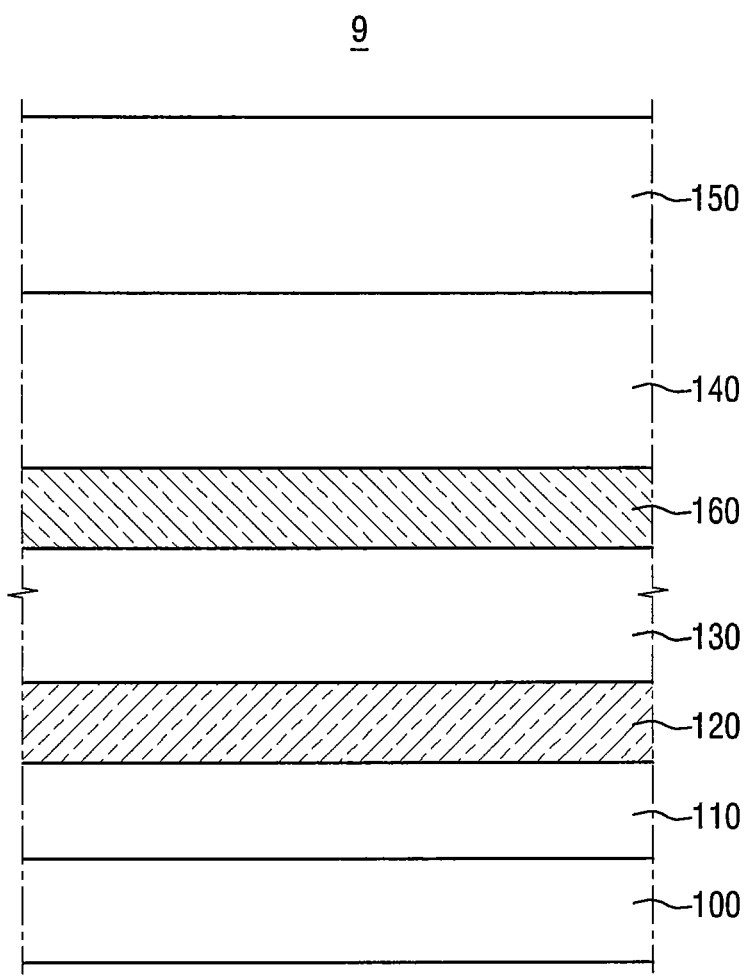
FIG. 11 is a diagram illustrating a semiconductor substrate according to a ninth embodiment of the present inventive concepts.
Figure 12:
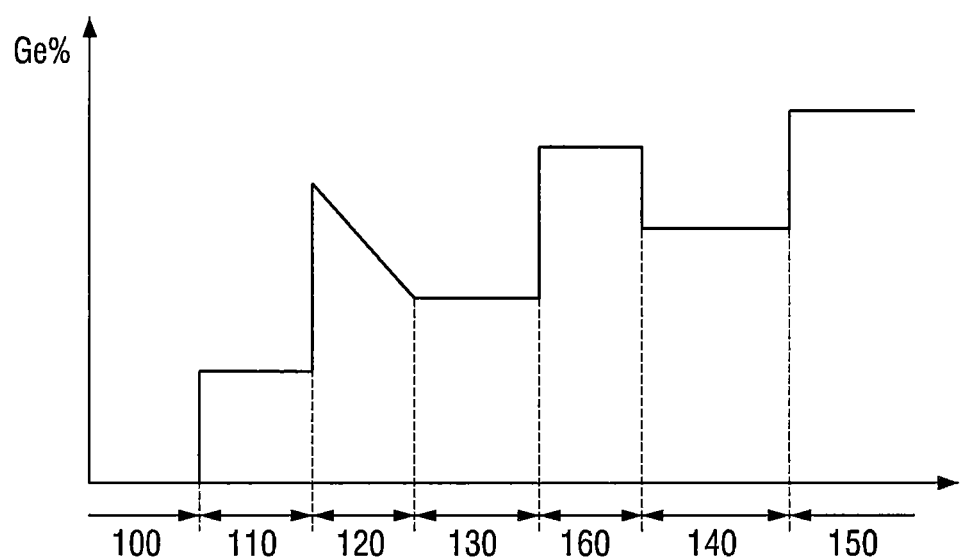
FIG. 12 is a schematic graph illustrating a germanium fraction of each layer included in the semiconductor substrate of FIG. 11.

FIG. 9 is a diagram illustrating a semiconductor substrate according to an eighth embodiment of the present inventive concepts. FIG. 10 is a schematic graph illustrating a germanium fraction of each layer included in the semiconductor substrate of FIG. 9. FIG. 11 is a diagram illustrating a semiconductor substrate according to a ninth embodiment of the present inventive concepts. FIG. 12 is a schematic graph illustrating a germanium fraction of each layer included in the semiconductor substrate of FIG. 11. For convenience of explanation, differences from those described with reference to FIGS. 1 and 2 will be mainly described.

Referring to FIGS. 9 and 10, a semiconductor substrate 8 according to the eighth embodiment of the present inventive concepts may further include a second strain released layer 160 disposed between the first strain relaxed buffer layer 110 and the base substrate 100. In other words, the second strain released layer 160 may be formed adjacent to the base substrate 100 than the first strain released layer 120. The second strain released layer 160 may include a compound semiconductor. The second strain released layer 160 may include, for example, the same material as that of the first strain relaxed buffer layer 110. That is, the second strain released layer 160 may include silicon germanium. The second strain released layer 160 may be formed on the base substrate 100 by an epitaxial growth method. The second strain released layer 160 may include, for example, $Si_{1-b}Ge_b$. Here, b may be greater than 0 and smaller than 1. The germanium fraction of the second strain released layer 160 may be uniform in the thickness direction of the second strain released layer 160.

In the semiconductor substrate 8 according to the eighth embodiment of the present inventive concepts, a germanium fraction of the lowermost part of the second strain released layer 160 may be greater than the germanium fraction of the uppermost part of the base substrate 100. Since the base substrate 100 may include a silicon substrate and the first strain relaxed buffer layer 110 may have a constant or uniform germanium fraction in the thickness direction of the base substrate 100, the germanium fraction of the second strain released layer 160 may be greater than the germanium fraction of the base substrate 100.

In addition, in the semiconductor substrate 8 according to the eighth embodiment of the present inventive concepts, the germanium fraction of the uppermost part of the second strain released layer 160 may be greater than the germanium fraction of the lowermost part of the first strain relaxed buffer layer 110.

Since each of the first strain relaxed buffer layer 110 and the second strain released layer 160 may have a uniform germanium fraction in the thickness direction of the base substrate 100, the germanium fraction of the second strain released layer 160 may be greater than the germanium fraction of the first strain relaxed buffer layer 110. That is, b may be greater than x.

Referring to FIGS. 11 and 12, a semiconductor substrate 9 according to a ninth embodiment of the present inventive concepts may further include a second strain released layer 160 that is disposed between the second strain relaxed buffer layer 130 and the third strain relaxed buffer layer 140. In other words, the second strain released layer 160 may be formed further from the base substrate 100 than the first strain released layer 120. In the semiconductor substrate 9 according to the ninth embodiment of the present inventive concepts, the germanium fraction of the lowermost part of the second strain released layer 160 may be greater than the germanium fraction of the uppermost part of the second strain relaxed buffer layer 130. In other words, since each of the second strain relaxed buffer layer 130 and the second strain released layer 160 may have a constant or uniform germanium fraction in the thickness direction of the base substrate 100, the germanium fraction of the second strain released layer 160 may be greater than the germanium fraction of the second strain relaxed buffer layer 130.

In addition, in the semiconductor substrate 9 according to the ninth embodiment of the present inventive concepts, the germanium fraction of the uppermost part of the second strain released layer 160 may be greater than the germanium fraction of the lowermost part of the third strain relaxed buffer layer 140. Since each of the third strain relaxed buffer layer 140 and the second strain released layer 160 may have a uniform germanium fraction in the thickness direction of the base substrate 100, the germanium fraction of the second strain relaxed buffer layer 160 may be greater than the germanium fraction of the third strain relaxed buffer layer 140. That is, b may be greater than z. More generally, the second strain released layer 160 may have a greater lattice constant than both an underlying layer and an overlying layer in some embodiments.

Figure 13:
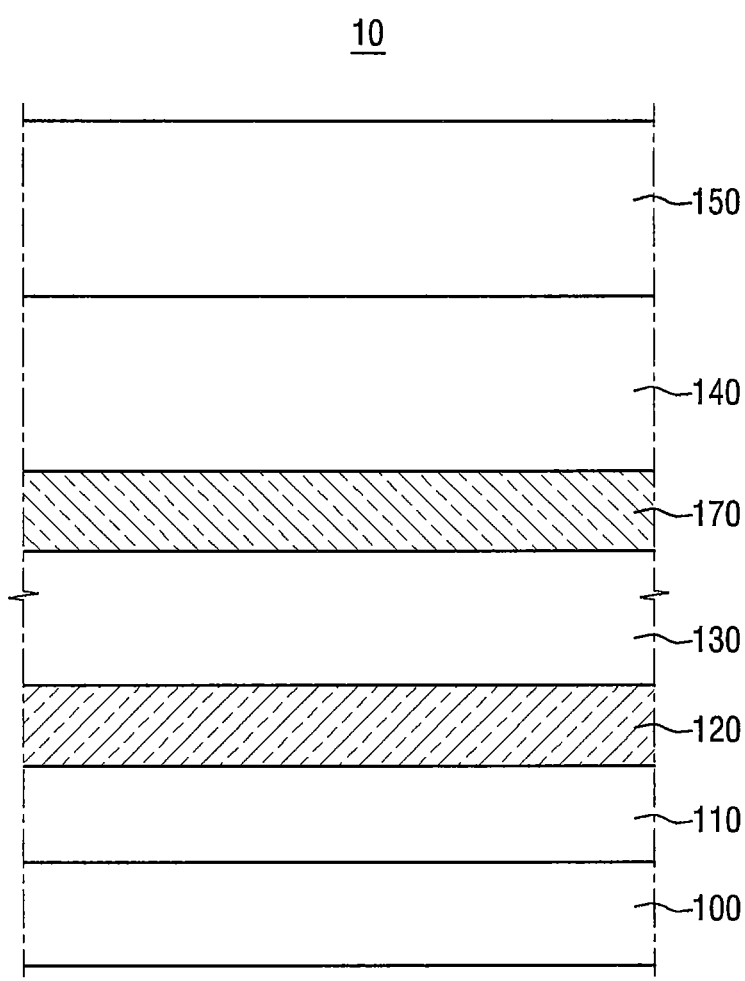
FIG. 13 is a diagram illustrating a semiconductor substrate according to a tenth embodiment of the present inventive concepts.
Figure 14:
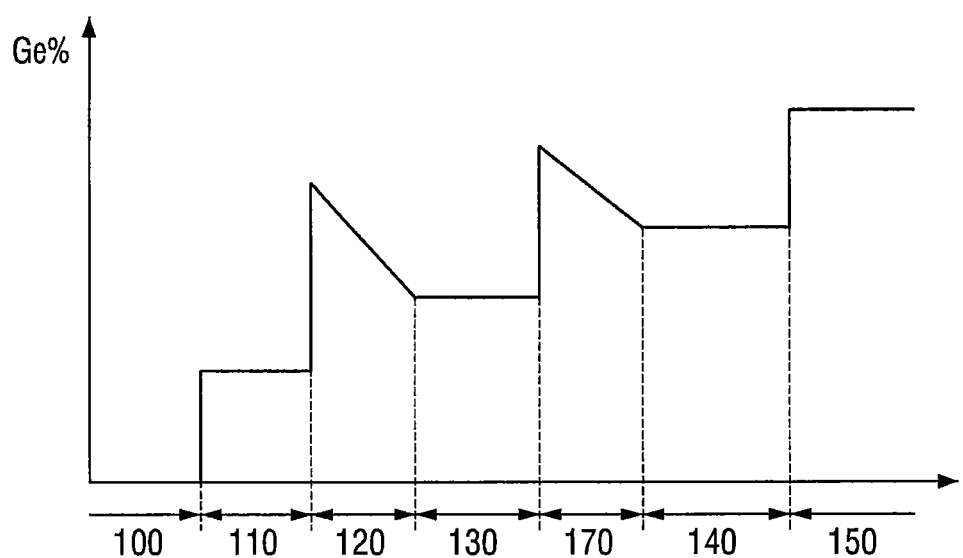
FIG. 14 is a schematic graph illustrating a germanium fraction of each layer included in the semiconductor substrate of FIG. 13.

FIG. 13 is a diagram illustrating a semiconductor substrate according to a tenth embodiment of the present inventive concepts. FIG. 14 is a schematic graph illustrating a germanium fraction of each layer included in the semiconductor substrate of FIG. 13. For convenience of explanation, differences from those described with reference to FIGS. 1 and 2 will be mainly described.

Referring to FIGS. 13 and 14, the semiconductor substrate 10 according to the tenth embodiment of the present inventive concepts may further include a third strain released layer 170. The third strain released layer 170 may be disposed between the second strain relaxed buffer layer 130 and the third strain relaxed buffer layer 140. That is, the third strain released layer 170 may be formed on the first strain released layer 120. The third strain released layer 170 may include a compound semiconductor. The third strain released layer 170 may include, for example, the same material as that of the first strain relaxed buffer layer 110.

That is, the third strain released layer 170 may be a silicon germanium layer including silicon germanium. The third strain released layer 170 may be formed on the second strain relaxed buffer layer 130 by an epitaxial growth method.

The third strain released layer 170 may include, for example, $Si_{1-c}Ge_c$. Here, c may be greater than 0 and smaller than 1. The germanium fraction of the third strain released layer 170 may vary along the thickness direction of the third strain released layer 170. That is, the value of c may vary along the thickness direction of the third strain released layer 170. For example, the germanium fraction of the third strain released layer 170 may decrease in a direction away or with distance from the base substrate 100. That is, the germanium fraction of the third strain released layer 170 at a portion nearest to the second strain relaxed buffer layer 130 may be greater than the germanium fraction of the third strain released layer 170 at a portion farthest from the second strain relaxed buffer layer 130.

In addition, the germanium fraction of the third strain released layer 170 may continuously decrease in a direction away or with distance from the base substrate 100, but embodiments of the present inventive concepts are not limited thereto. That is, as described in FIG. 5, the germanium fraction of the third strain released layer 170 may decrease in a stepwise manner or fashion in a direction away or with distance from the base substrate 100. Since the germanium fraction of the third strain released layer 170 decreases in a direction away or with distance from the base substrate 100, the lattice constant of the third strain released layer 170 may decrease in a direction away or with distance from the base substrate 100.

The germanium fraction of the lowermost part of the third strain released layer 170 may be greater than the germanium fraction of the uppermost part of the second strain relaxed buffer layer 130. In FIG. 14, the germanium fraction of the lowermost part of the third strain relaxed buffer layer 140 is illustrated as being substantially the same as the germanium fraction of the uppermost part of the third strain released layer 170, but embodiments of the present inventive concepts are not limited thereto. That is, the germanium fraction of the lowermost part of the third strain relaxed buffer layer 140 may be greater than or smaller than the germanium fraction of the uppermost part of the third strain released layer 170.

Figure 15:
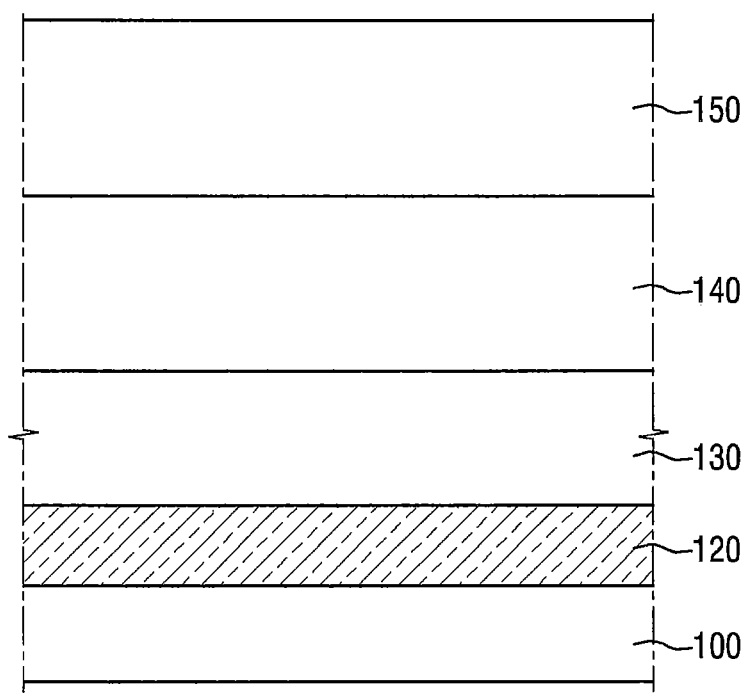
FIG. 15 is a diagram illustrating a semiconductor substrate according to an eleventh embodiment of the present inventive concepts.
Figure 16:
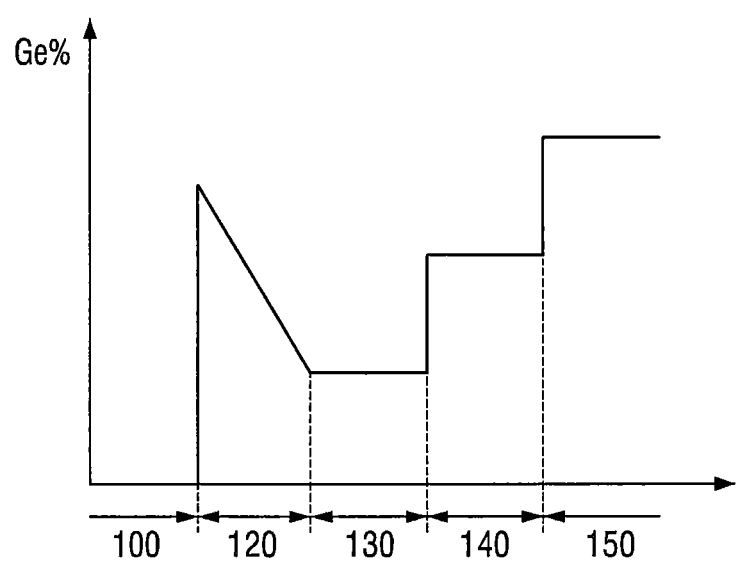
FIG. 16 is a schematic graph illustrating a germanium fraction of each layer included in the semiconductor substrate of FIG. 15.

FIG. 15 is a diagram illustrating a semiconductor substrate according to an eleventh embodiment of the present inventive concepts. FIG. 16 is a schematic graph illustrating a germanium fraction of each layer included in the semiconductor substrate of FIG. 15. For convenience of explanation, differences from those described with reference to FIGS. 1 and 2 will be mainly described.

Referring to FIGS. 15 and 16, in the semiconductor substrate 11 according to the eleventh embodiment of the present inventive concepts, the first strain released layer 120 may be formed directly on the base substrate 100. In other words, the silicon germanium layer may not be inserted between the first strain released layer 120 and the base substrate 100. The germanium fraction of the lowermost part of the first strain released layer 120 may be greater than the germanium fraction of the uppermost part of the base substrate 100.

In FIG. 16, although it has been illustrated that the germanium fraction increases at a time or interface between the uppermost part of the base substrate 100 and the lowermost part of the first strain released layer 120, it is only intended for the convenience of explanation and embodiments of the present inventive concepts are not limited thereto. That is, the germanium fraction may fluctuate between the base substrate 100 and the first strain released layer 120, due to an occurrence of intermixing such as diffusion between the base substrate 100 and the first strain released layer 120.

Figure 17:
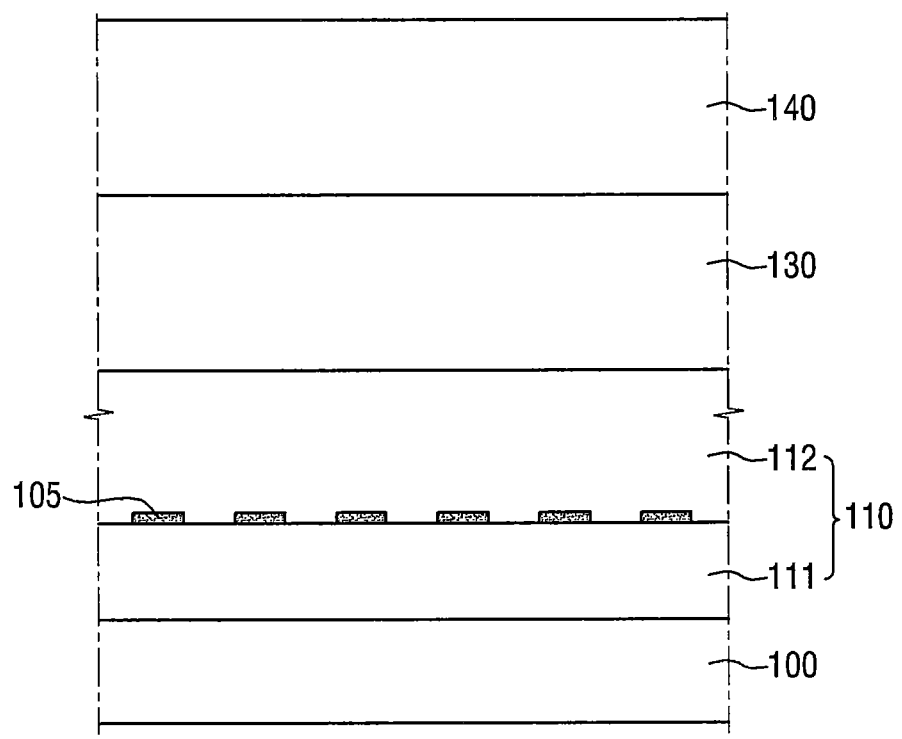
FIG. 17 is a diagram illustrating a semiconductor substrate according to a twelfth embodiment of the present inventive concepts.
Figure 18:
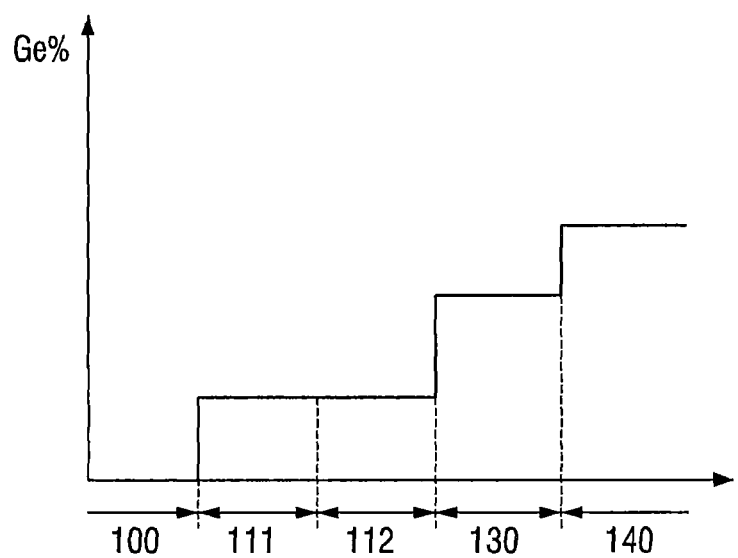
FIG. 18 is a schematic graph illustrating a germanium fraction of each layer included in the semiconductor substrate of FIG. 17.

FIG. 17 is a diagram illustrating a semiconductor substrate according to a twelfth embodiment of the present inventive concepts. FIG. 18 is a schematic graph illustrating a germanium fraction of each layer included in the semiconductor substrate of FIG. 17. For convenience of explanation, the repeated parts of the contents described in FIGS. 1, 2 and 6 will be omitted.

Referring to FIGS. 17 and 18, a semiconductor substrate 12 according to the twelfth embodiment of the present inventive concepts includes a base substrate 100, a first strain relaxed buffer layer 110, a second strain relaxed buffer layer 130, a third strain relaxed buffer layer 140 and an insulating film pattern 105.

The first strain relaxed buffer layer 110 is formed on the base substrate 100. The first strain relaxed buffer layer 110 may include a first lower strain relaxed buffer layer 111 and a first upper strain relaxed buffer layer 112. The first lower strain relaxed buffer layer 111 and the first upper strain relaxed buffer layer 112 may be sequentially laminated on the base substrate 100. Each of the first lower strain relaxed buffer layer 111 and the first upper strain relaxed buffer layer 112 may include a compound semiconductor. For example, each of the first lower strain relaxed buffer layer 111 and the first upper strain relaxed buffer layer 112 may be a silicon germanium film including silicon germanium. Also, the germanium fraction of the first lower strain relaxed buffer layer 111 and the germanium fraction of the first upper strain relaxed buffer layer 112 may be substantially the same as each other.

The insulating film pattern 105 may be disposed within the first strain relaxed buffer layer 110. More specifically, the insulating film pattern 105 may be formed above the first lower strain relaxed buffer layer 111. The first upper strain relaxed buffer layer 112 may be formed above the insulating film pattern 105 and the first lower strain relaxed buffer layer 111. The second strain relaxed buffer layer 130 and the third strain relaxed buffer layer 140 may be sequentially disposed on the first strain relaxed buffer layer 110. The germanium fraction of the second strain relaxed buffer layer 130 may be greater than the germanium fraction of the first strain relaxed buffer layer 110. The germanium fraction of the third strain relaxed buffer layer 140 may be greater than the germanium fraction of the second strain relaxed buffer layer 130.

Figure 19:
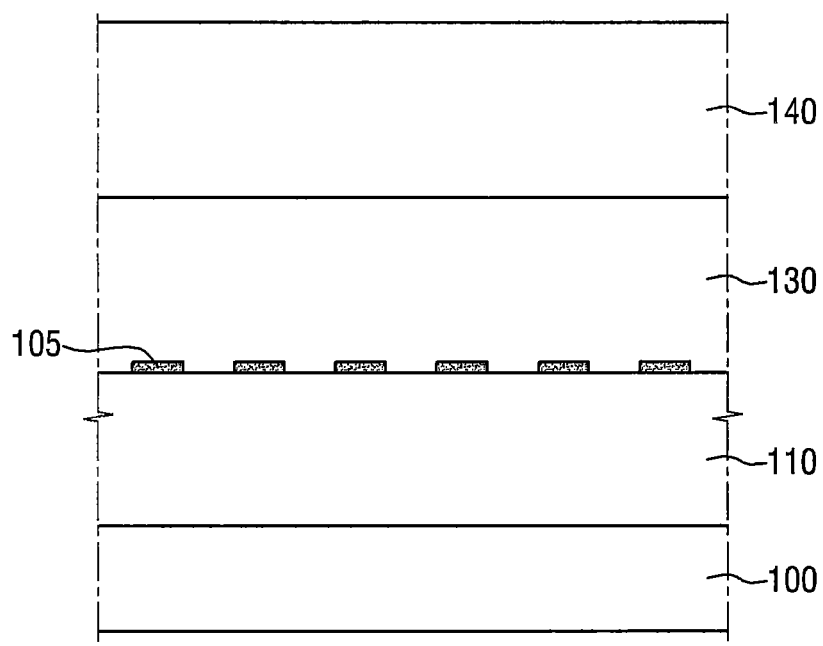
FIG. 19 is a diagram illustrating a semiconductor substrate according to a thirteenth embodiment of the present inventive concepts.

FIG. 19 is a diagram illustrating a semiconductor substrate according to a thirteenth embodiment of the present inventive concepts. For convenience of explanation, differences from those described with reference to FIGS. 17 and 18 will be mainly described.

Referring to FIG. 19, in the semiconductor substrate 13 according to the thirteenth embodiment of the present inventive concepts, the insulating film pattern 105 may be disposed between the first strain relaxed buffer layer 110 and the second strain relaxed buffer layer 130. That is, the insulating film pattern 105 may be formed between the first strain relaxed buffer layer 110 and the second strain relaxed buffer layer 130 having the germanium fractions different from each other. The second strain relaxed buffer layer 130 may be formed above the insulating film pattern 105 and the first strain relaxed buffer layer 110.

Figure 20:
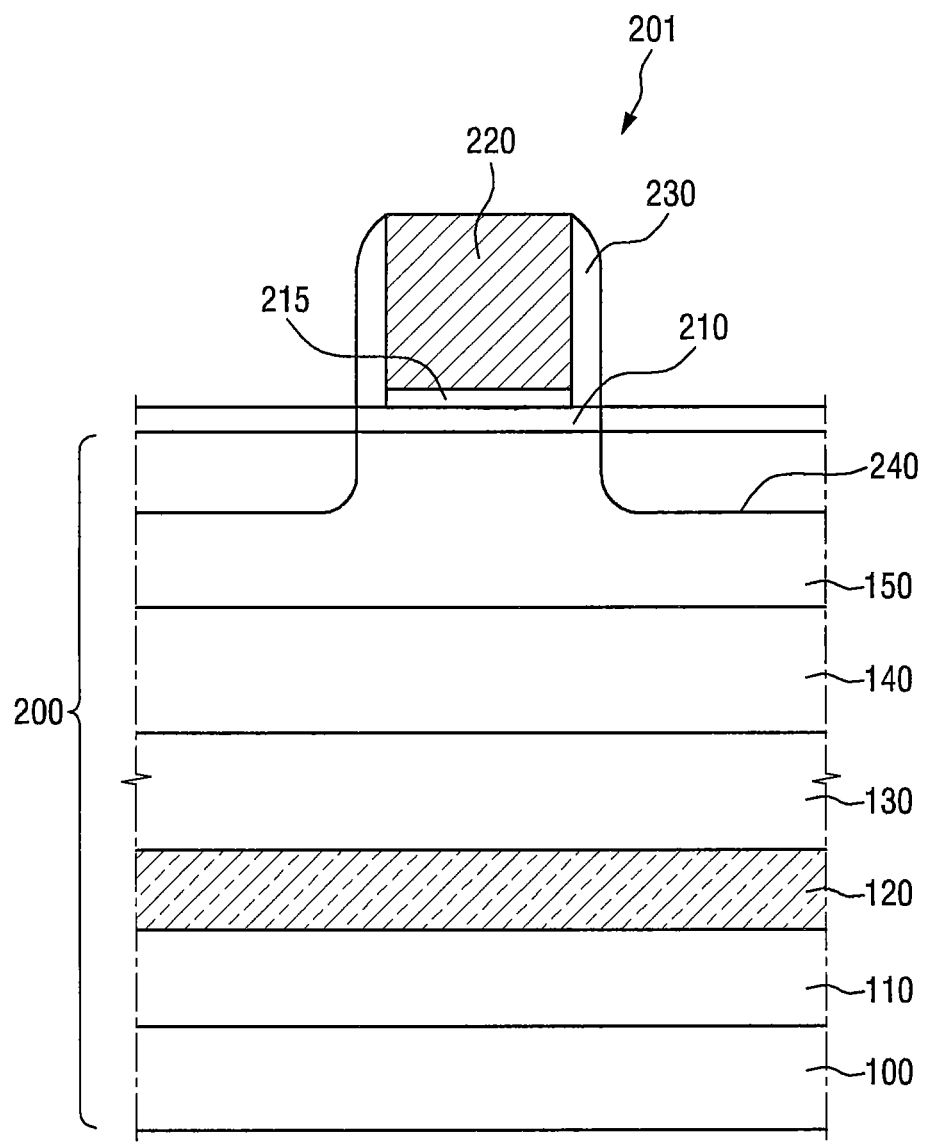
FIG. 20 is a diagram illustrating a semiconductor device according to an embodiment of the present inventive concepts.

FIG. 20 is a diagram illustrating a semiconductor device according to an embodiment of the present inventive concepts. For reference, semiconductor devices according to an embodiment of the present inventive concepts may include the above-mentioned semiconductor substrates 1 to 13, but FIG. 20 illustrates a semiconductor device including the semiconductor substrates 1 to 4 described using FIG. 1 as an example.

Referring to FIG. 20, a semiconductor device 201 according to an embodiment of the present inventive concepts may be a transistor structure including a semiconductor substrate 200, a first channel layer 210, a first gate electrode 220 or the like. Since the description of the semiconductor substrate 200 is substantially the same as that described with reference to FIG. 1, it will be omitted.

A first channel layer 210 may be formed on the semiconductor substrate 200. The first channel layer 210 may be used as a channel region of the semiconductor device 201. The first channel layer 210 may include, for example, at least one of silicon, silicon germanium, germanium, or a group III-V compound semiconductor. For example, the first channel layer 210 may have other materials depending on whether the semiconductor device 201 is PMOS or NMOS. If the first channel layer 210 is a silicon germanium layer including silicon germanium, the germanium fraction of the first channel layer 210 may be different from the germanium fraction of the fourth strain relaxed buffer layer 150 located below the first channel layer 210.

The first gate electrode 220 may be formed on the first channel layer 210. The first gate electrode 220 may include, for example, but not limited to, polysilicon or metallic material. A hard mask may be further formed on the first gate electrode 220.

The first gate insulating film 215 may be formed between the first gate electrode 220 and the first channel layer 210. The first gate insulating film 215 may include, for example, a silicon oxide film, a silicon oxynitride film, a silicon nitride film or a high dielectric constant dielectric film having a dielectric constant higher than the silicon nitride film. The high dielectric constant dielectric film may include, for example, but not limited to, one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead smaydium tantalum oxide or lead zinc niobate.

A first gate spacer 230 may be formed on the side wall of the first gate electrode 220. The first gate spacer 230 may include, for example, silicon oxide, silicon nitride silicon oxynitride or the like.

First source/drain regions 240 may be formed at both sides of the first gate electrode 220 and may be formed within the semiconductor substrate 200. In FIG. 20, the first source/drain regions 240 has been illustrated, for example, as being formed within the fourth strain relaxed buffer layer 150 of the semiconductor substrate 200, but embodiments of the present inventive concepts are not limited thereto. The first source/drain regions 240 may be formed by doping the p-type impurities or the n-type impurities within the semiconductor substrate 200, but embodiments of the present inventive concepts are not limited thereto. That is, after removing a part of the semiconductor substrate 200, by growing it again using the epitaxial growth method, the first source/drain regions 240 may be formed.

In FIG. 20, it has been illustrated that the first channel layer 210 extends laterally from the side wall of the first gate electrode 220 and the first source/drain regions 240 are also formed on the first channel layer 210, but embodiments of the present inventive concepts are not limited thereto. The first channel layer 210 may not laterally extend from the first gate electrode 220 and/or the first gate spacer 230 and the first source/drain regions 240 may not be formed within the first channel layer 210.

Figure 21:
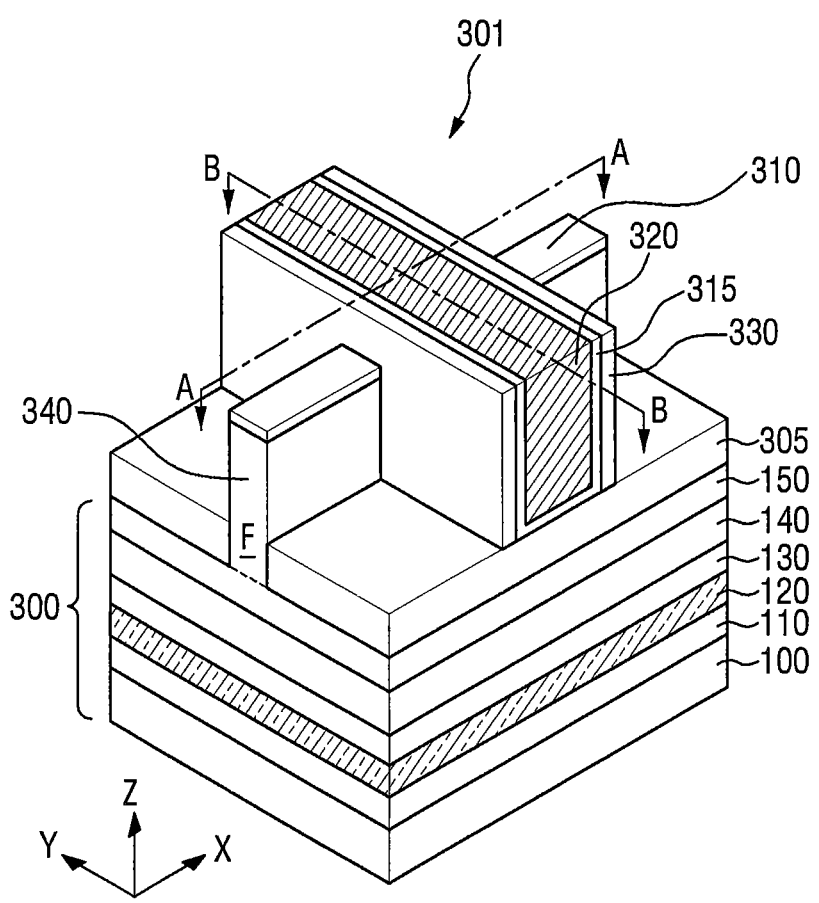
FIG. 21 is a diagram illustrating a semiconductor device according to another embodiment of the present inventive concepts.
Figure 22:
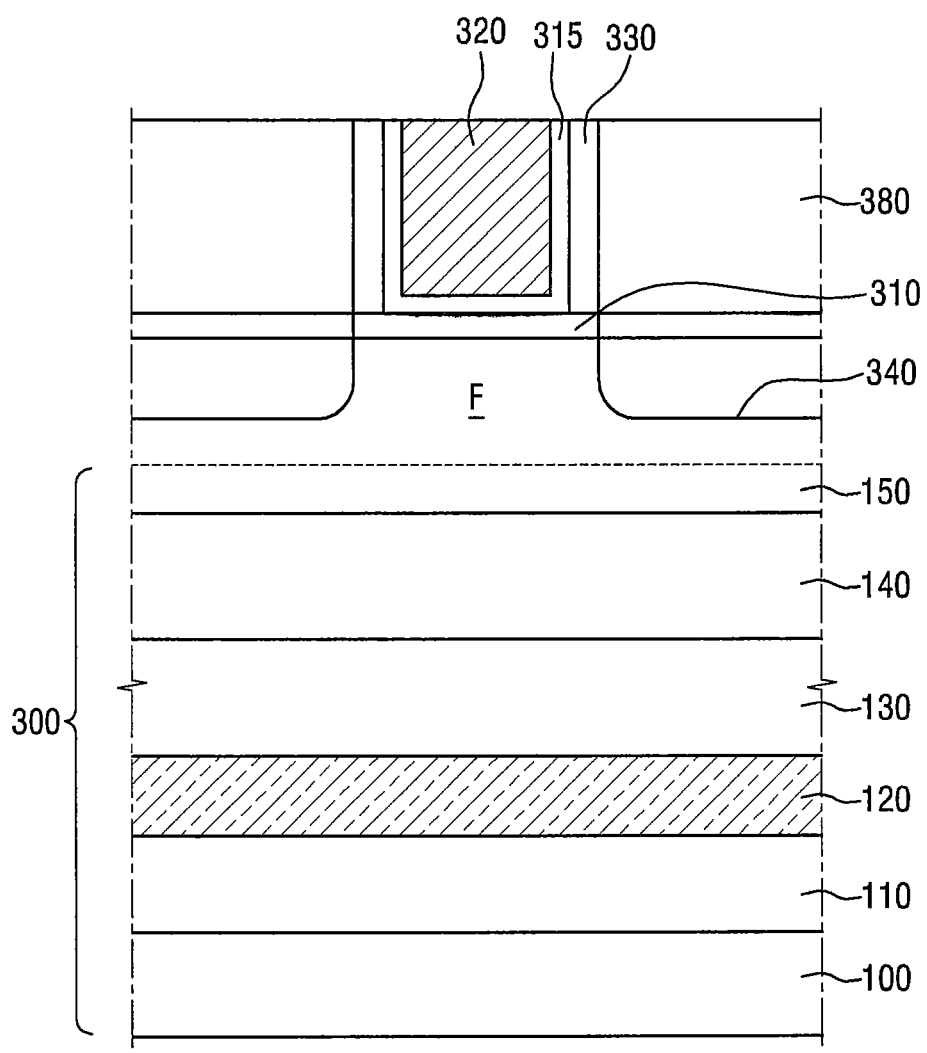
FIG. 22 is a cross-sectional view taken along a line A-A of FIG. 21.
Figure 23:
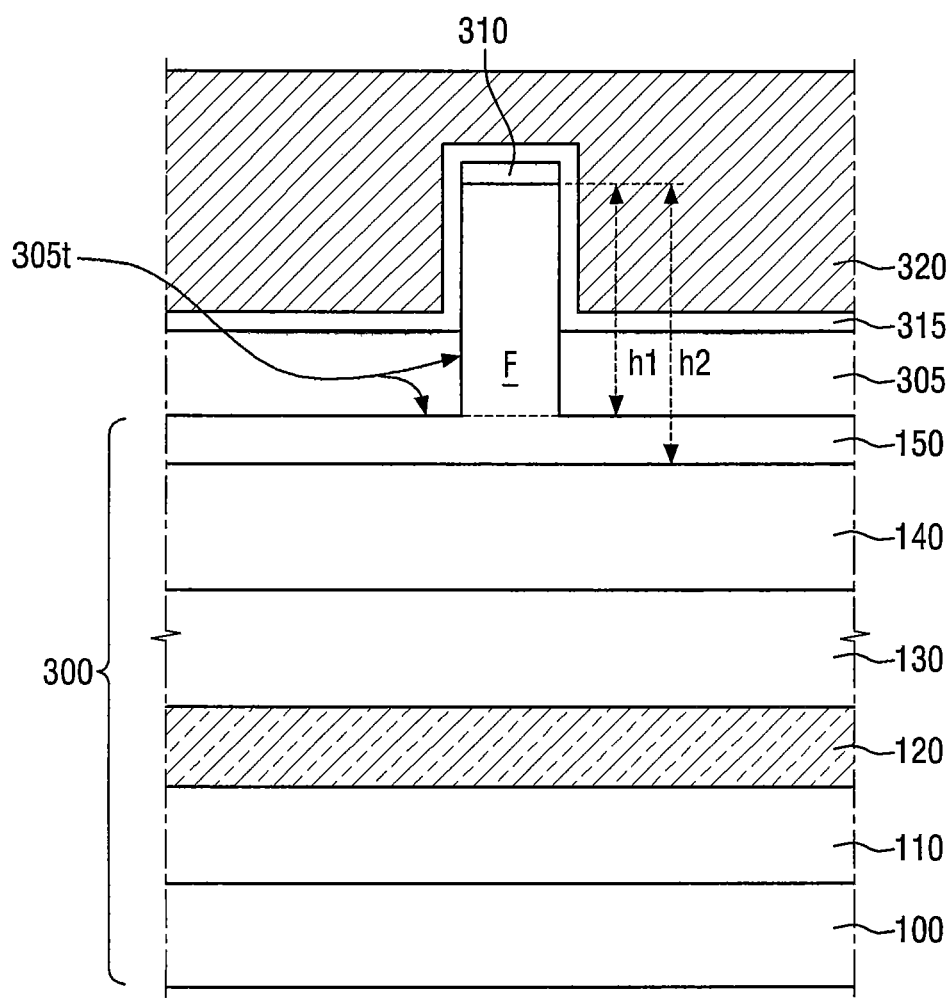
FIG. 23 is a cross-sectional view taken along a line B-B of FIG. 21.

FIG. 21 is a diagram illustrating a semiconductor device according to another embodiment of the present inventive concepts. FIG. 22 is a cross-sectional view taken along a line A-A of FIG. 21. FIG. 23 is a cross-sectional view taken along a line B-B of FIG. 21. For reference, although semiconductor devices according to another embodiment of the inventive concepts may include the above-mentioned semiconductor substrates 1 to 13, FIGS. 21 to 23 illustrate a semiconductor device including the semiconductor substrates 1 to 4 described using FIG. 1 as an example.

Referring to FIGS. 21 to 23, a semiconductor device 301 according to another embodiment of the present inventive concepts may include a semiconductor substrate 300, a fin type active pattern F, a second channel layer 310, a second gate electrode 320 or the like. Since the description of the semiconductor substrate 300 is substantially the same as the contents described using FIG. 1, it will be omitted.

The fin type active pattern F may protrude from the semiconductor substrate 300. Since a field insulating film 305 covers a part of the side wall of the fin type active pattern F, at least a part of the fin type active pattern F may protrude above the upper surface of the field insulating film 305. The fin type active pattern F may be defined by the field insulating film 305. The fin type active pattern F may extend along a first direction X. The field insulating films 305 may include, for example, but not limited to, an oxide film, a nitride film, an oxynitride film or a combination thereof.

In the semiconductor device 301 according to another embodiment of the present inventive concepts, the fin type active pattern F may be formed by etching a part of the fourth strain relaxed buffer layer 150 of the semiconductor substrate 300. In other words, the fourth strain relaxed buffer layer 150 may include a trench 305t formed within the fourth strain relaxed buffer layer 150. The fin type active pattern F may be formed by the trench 305t. The fin type active pattern F may also be described as part of the fourth strain relaxed buffer layer 150. Therefore, the fin type active pattern F and the fourth strain relaxed buffer layer 150 may be an integral structure.

The field insulating film 305 may fill a part of the trench 305t formed within the fourth strain relaxed buffer layer 150. Thus, a part of the fin type active pattern F, that is, a part of the fourth strain relaxed buffer layer 150 may protrude upward from the upper surface of the field insulating film 305. That is, the upper surface of the field insulating film 305 may be further adjacent or closer to the base substrate 100 than the upper surface of the fourth strain relaxed buffer layer 150.

The depth of the trench 305t formed within the fourth strain relaxed buffer layer 150 may be h1, and the thickness of the fourth strain relaxed buffer layer 150 including the fin type active pattern F may be h2. For example, although a ratio of the depth h1 of the trench 305t formed within the fourth strain relaxed buffer layer 150 to the thickness h2 of the fourth strain relaxed buffer layer 150 including the fin type active pattern F may be greater than 0.4 and smaller than 0.95, the ratio may differ depending on the design object of the semiconductor device 301.

The second channel layer 310 may be formed on the fin type active pattern F. For example, the second channel layer 310 may be formed on the upper surface of the fin type active pattern F. The second channel layer 310 may be extended along the first direction X like the fin type active pattern F, but embodiments of the present inventive concepts are not limited thereto. The second channel layer 310 may include, for example, at least one of silicon, silicon germanium, germanium, and group III-V compound semiconductor. For example, the second channel layer 310 may have other materials depending on whether the semiconductor device 301 is PMOS or NMOS.

The second gate electrode 320 extends in the second direction Y and may be formed so as to intersect with the fin type active pattern F and the second channel layer 310. The second gate electrode 320 may be formed on the fin type active pattern F, the second channel layer 310 and the field insulating film 105. The second gate electrode 320 may include, for example, but not limited to, polysilicon or a metallic material. The second gate electrode 320 may be formed so as to intersect with the fin type active pattern F which protrudes upward from the upper surface of the field insulating film 305, in other words, the fourth strain relaxed buffer layer 150.

The second gate insulating film 315 may be formed between the second channel layer 310 and the second gate electrode 320. The second gate insulating film 315 may be formed between the side wall of the fin type active pattern F protruding upward from the field insulating film 305 and the second gate electrode 320. The second gate insulating film 315 may be disposed between the second gate electrode 320 and the gate spacer 330. Further, the second gate insulating film 315 may be disposed between the second gate electrode 320 and the field insulating film 305. The second gate insulating film 315 may include, for example, a silicon oxide film, a silicon oxynitride film, a silicon nitride film or a high dielectric constant dielectric film having a dielectric constant higher than the silicon nitride film.

The second gate spacer 330 may be formed on the side wall of the second gate electrode 320 extending in a second direction Y. The second gate spacer 330 may include, for example, silicon oxide, silicon nitride or silicon oxynitride.

Second source/drain regions 340 may be formed at both sides of the second gate electrode 320 and may be formed within the fin type active pattern F. The second source/drain regions 340 may be formed by doping the p-type impurities or the n-type impurities within the fin type active pattern F, but embodiments of the present inventive concepts are not limited thereto.

Alternatively, unlike that illustrated in FIG. 21, the second source/drain regions 340 may be formed using an epitaxial growth method after removing a part of the fin type active pattern F, or the second source/drain regions 340 may each be formed by forming an epitaxial layer on the side wall and the upper surface of the fin type active pattern F protruding upward from the field insulating film 305.

In FIGS. 21 and 22, it has been illustrated that the second channel layer 310 is extended from the side wall of the second gate electrode 320 in the first direction X and the second source/drain regions 340 are also formed in the second channel layer 310, but embodiments of the present inventive concepts are not limited thereto. The second channel layer 310 may not extend in the first direction X from the second gate electrode 320 and/or the second gate spacer 330, and the second source/drain regions 340 may not be formed within the second channel layer 310.

Figure 24:
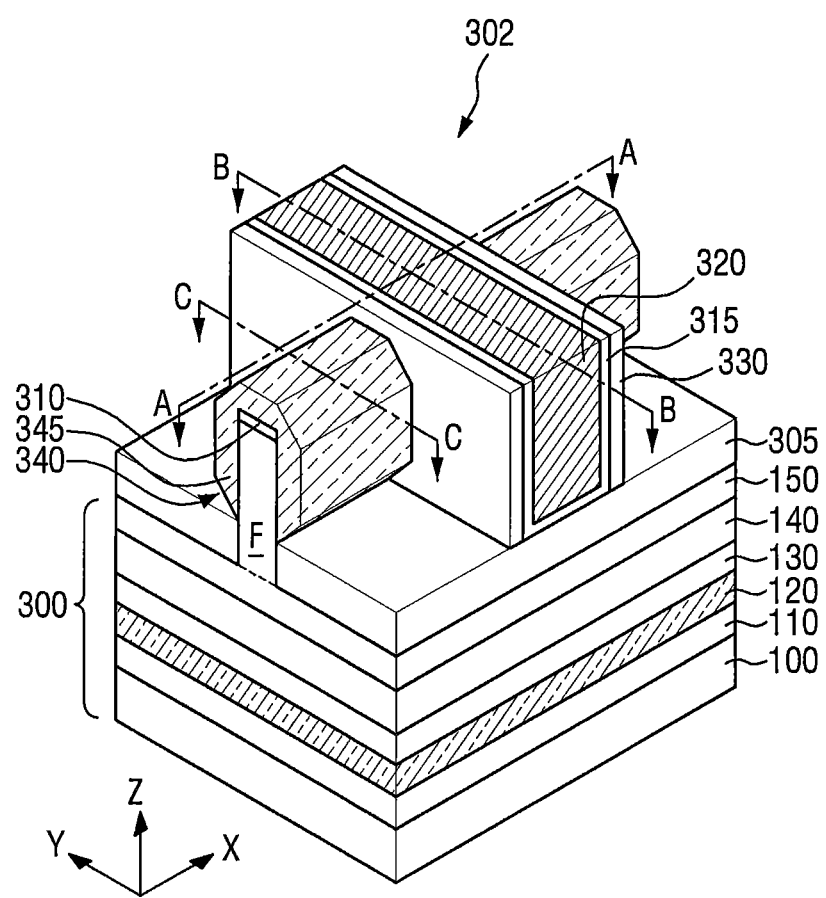
FIG. 24 is a diagram illustrating a semiconductor device according to still another embodiment of the present inventive concepts.
Figure 25:
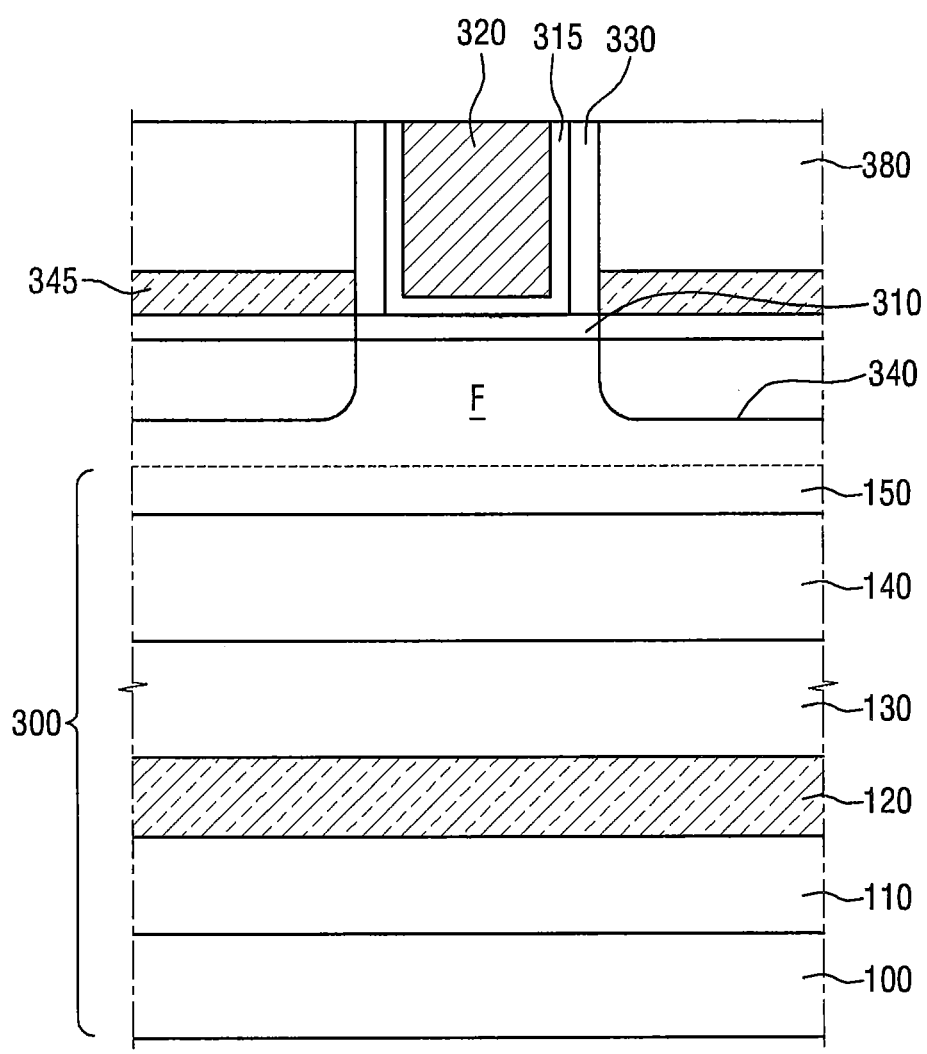
FIG. 25 is a cross-sectional view taken along a line A-A of FIG. 24.
Figure 26:
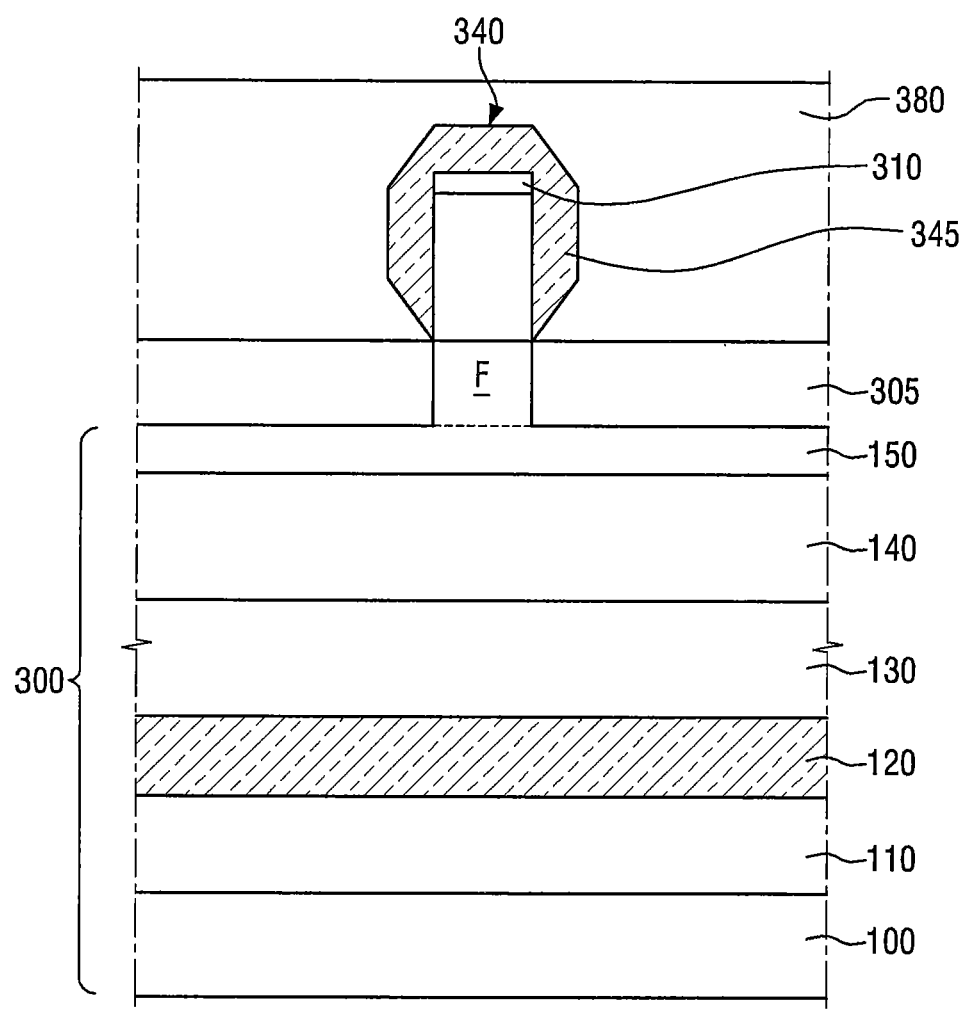
FIG. 26 is a cross-sectional view taken along a line C-C of FIG. 24.

FIG. 24 is a diagram illustrating a semiconductor device according to still another embodiment of the present inventive concepts. FIG. 25 is a cross-sectional view taken along a line A-A in FIG. 24. FIG. 26 is a cross-sectional view taken along a line C-C in FIG. 24. For convenience of explanation, the differences from the embodiments described using FIGS.

21 to 23 will be mainly illustrated. For reference, the cross-sectional view taken along the line B-B of FIG. 24 is substantially the same as that of FIG. 23.

With reference to FIGS. 24 to 26, in a semiconductor device 302 according to still another embodiment of the present inventive concepts, the second source/drain 340 regions may each include an epitaxial layer 345 formed on the side wall of the fin type active pattern F. The epitaxial layer 345 may be formed on the side wall and the upper surface of the fin type active pattern F protruding upward from the upper surface of the field insulating film 305. In other words, the epitaxial layer 345 may be formed along the profile of the fin type active pattern F protruding upward from the upper surface of the field insulating film 305. If the fin type active pattern F formed from the fourth strain relaxed buffer layer 150 includes silicon germanium, the epitaxial layer 345 may include, for example, but not limited to, silicon, silicon germanium, germanium, etc.

In FIGS. 24 and 25, it has been illustrated that the second channel layer 310 extends from the side wall of the second gate electrode 320 in the first direction X, and extends between the epitaxial layer 345 and the fin type active pattern F, but embodiments of the present inventive concepts are not limited thereto.

Also, in FIGS. 24 to 26, the second source/drain regions 340 has been illustrated as being formed within the epitaxial layer 345, the second channel layer 310 and the fin type active pattern F, but embodiments of the present inventive concepts are not limited thereto. The second channel layer 310 may not extend between the epitaxial layer 345 and the fin type active pattern F, and the second source/drain regions 340 may not be formed within the second channel layer 310.

Figure 27:
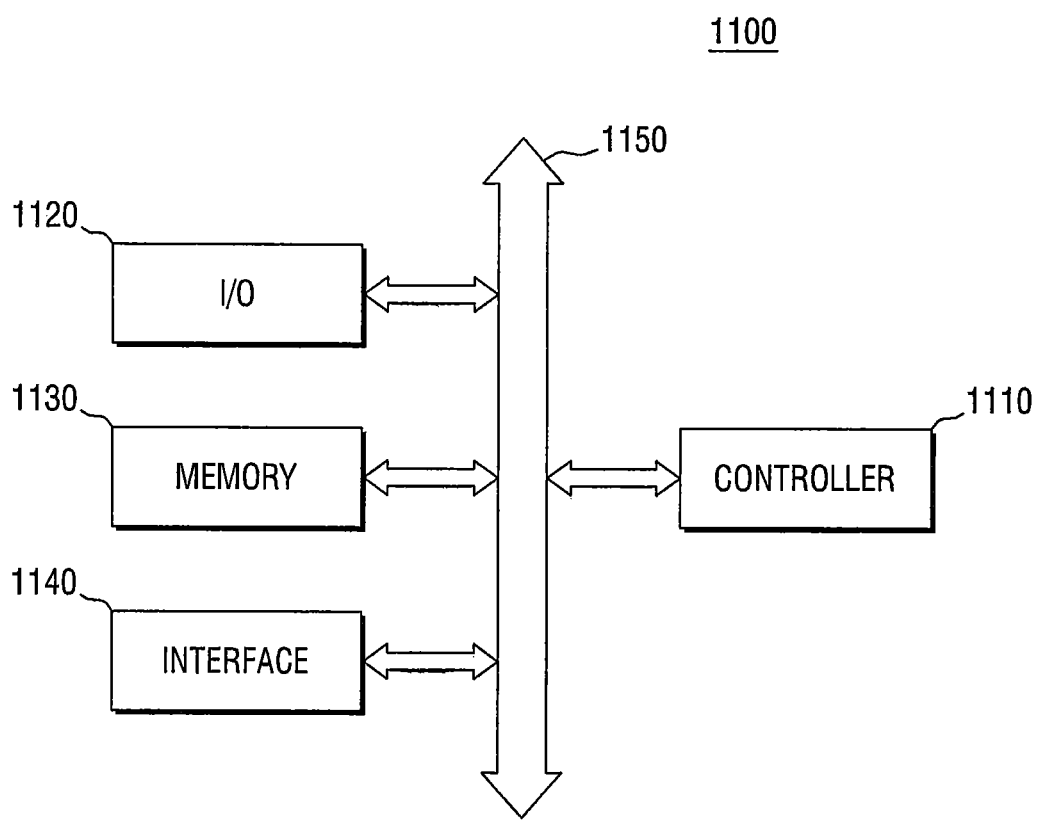
FIG. 27 is a block diagram of an electronic system including a semiconductor device according to some embodiments of the present inventive concepts.

FIG. 27 is a block diagram of an electronic system including semiconductor devices according to some embodiments of the present inventive concepts.

Referring to FIG. 27, an electronic system 1100 according to an embodiment of the present inventive concepts may include a controller 1110, an input/output device (I/O) 1120, a memory device 1130, an interface 1140 and a bus 1150. The controller 1110, the input/output device 1120, the memory device 1130 and/or the interface 1140 may be coupled together via a bus 1150. The bus 1150 corresponds to a path through which the data are moved.

The controller 1110 may include at least one of a microprocessor, a digital signal process, a microcontroller, and logic elements capable of performing the function similar to these elements. The input/output device 1120 may include a keypad, a keyboard, a display device or the like. The memory device 1130 may store data and/or command. The interface 1140 may perform a function of transmitting the data to the communication network or receiving the data from the communication network. The interface 1140 may be a wired or wireless form. For example, the interface 1140 may include an antenna, a wired and wireless transceiver or the like. Although it is not illustrated, the electronic system 1100 may further include a high-speed DRAM and/or SDRAM as an operation memory for improving the operation of the controller 1110. Semiconductor devices according to some embodiments of the present inventive concepts may be provided inside the memory device 1130 or may be provided as a part of the controller 1110 or the input/output device (I/O) 1120.

The electronic system 1100 may be applied to a personal digital assistant (PDA), a portable computer, a web tablet, a wireless phone, a mobile phone, a digital music player, a memory card, or all electronic products capable of transmitting and/or receiving information in a wireless environment.

Figure 28:
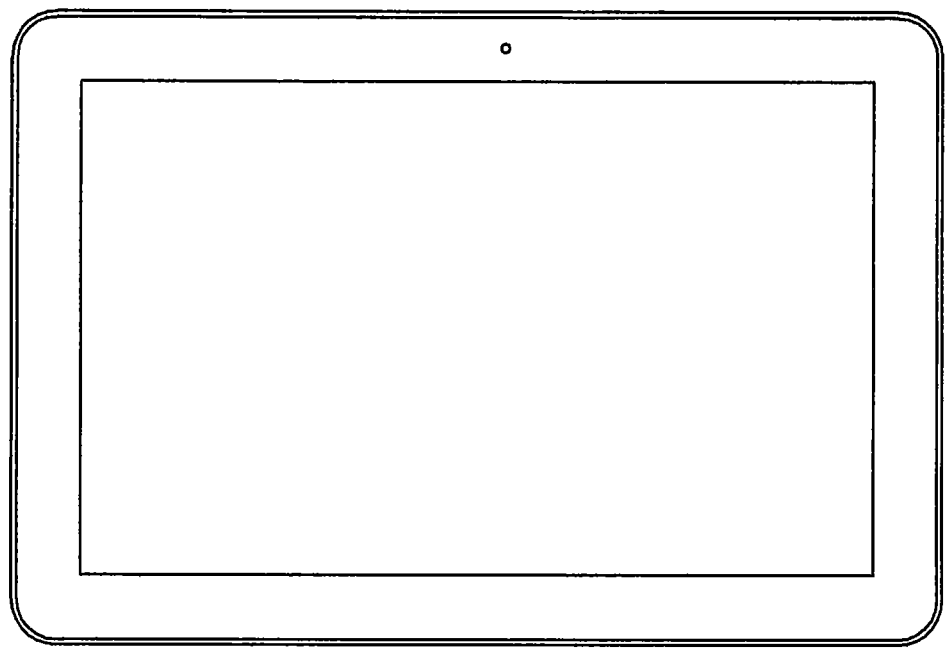
FIGS. 28 and 29 are example semiconductor systems to which the semiconductor devices according to some embodiments of the present inventive concepts may be applied.
Figure 29:
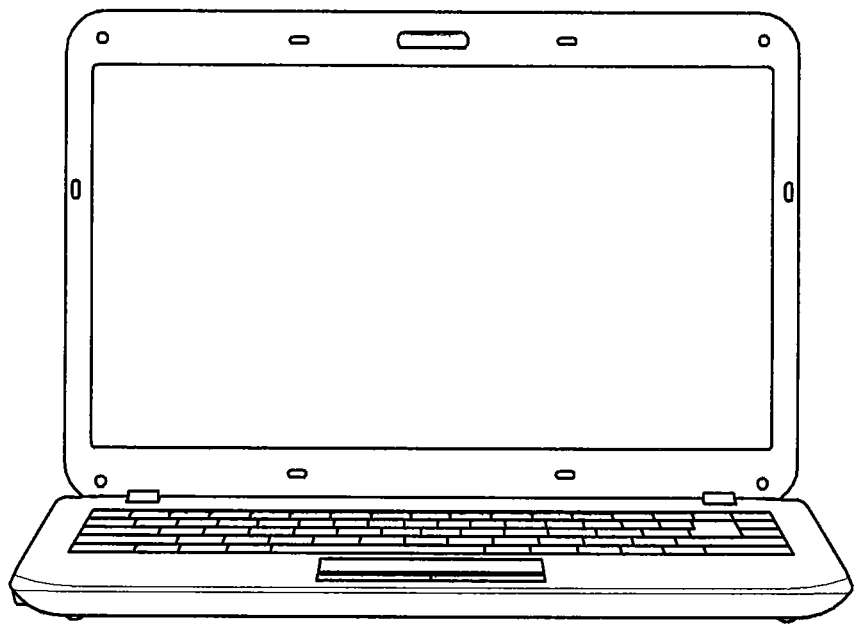

FIGS. 28 and 29 are example semiconductor systems to which the semiconductor devices according to some embodiments of the present inventive concepts may be applied. FIG. 28 is a tablet PC and FIG. 29 illustrates a laptop computer. At least one of the semiconductor devices 201, 301, 302 according to some embodiments of the present inventive concepts may be used in a tablet PC, a laptop computer or the like. Semiconductor devices according to some embodiments of the present inventive concepts may also be applied to other integrated circuit devices which are not illustrated.

Embodiments of the present inventive concepts have been described with reference to the attached drawings, but it may be understood by one of ordinary skill in the art that the present inventive concepts may be performed one of ordinary skill in the art in other specific forms without changing the technical concept or essential features of the present inventive concepts. Further, the above-described embodiments are merely examples and do not limit the scope of the rights of the present inventive concepts.

What is claimed is:

1. A semiconductor device comprising:
    a base substrate;
    a first silicon germanium layer on the base substrate;
    a second silicon germanium layer on the first silicon germanium layer, a germanium fraction of the second silicon germanium layer decreasing in a direction away from the base substrate, and the germanium fraction of the second silicon germanium layer at a lowermost part thereof being greater than a germanium fraction of an uppermost part of the first silicon germanium layer; and
    a gate electrode disposed on the second silicon germanium layer.

2. The semiconductor device of claim 1, further comprising a channel layer on the second silicon germanium layer and under the gate electrode,
    wherein the channel layer comprises silicon, germanium, silicon germanium, and/or a group III-V compound semiconductor.

3. The semiconductor device of claim 1, further comprising:
    a fin type active pattern on the second silicon germanium layer and a channel layer on the fin active pattern,
    wherein
    the gate electrode is disposed on the channel layer so as to intersect with the fin type active pattern.

4. The semiconductor device of claim 3, further comprising:
    source/drain regions at both sides of the gate electrode,
    wherein each of the source/drain regions includes an epitaxial layer formed on the fin type active pattern.

5. The semiconductor device of claim 3, wherein the fin type active pattern includes silicon germanium having a constant germanium fraction over a thickness thereof.

6. The semiconductor device of claim 1, further comprising:
    a third silicon germanium layer between the second silicon germanium layer and a channel layer,
    wherein a germanium fraction of a lowermost part of the third silicon germanium layer is greater than the germanium fraction of the uppermost part of the first silicon germanium layer, and wherein the germanium fraction of the second silicon germanium layer at the lowermost part thereof is greater than a germanium fraction of an uppermost part of the third silicon germanium layer.

7. The semiconductor device of claim 6, wherein the channel layer includes silicon germanium, and
a germanium fraction of the channel layer is greater than the germanium fraction of the third silicon germanium layer.

8. The semiconductor device of claim 1, further comprising:
a third silicon germanium layer having a constant germanium fraction over a thickness thereof between a channel layer and the base substrate.

9. The semiconductor device of claim 1, further comprising:
a third silicon germanium layer between a channel layer and the base substrate, the third silicon germanium layer having a germanium fraction which decreases in the direction away from the base substrate.

10. The semiconductor device of claim 1, wherein the base substrate includes a silicon substrate.

11. A semiconductor device comprising:
a substrate comprising a base layer and a first silicon germanium layer on the base layer;
a fin type active pattern which protrudes from the substrate and includes silicon germanium, a part of a side wall of the fin type active patterns being covered with a field insulating film;
a channel layer on the fin type active pattern;
a gate electrode on the channel layer, the gate electrode intersecting the fin type active pattern; and
an epitaxial layer formed on the side wall of the fin type active pattern at a side of the gate electrode,
wherein a germanium fraction of the first silicon germanium layer decreases in a direction away from the base layer, and the germanium fraction of the first silicon germanium layer at a lowermost part thereof is greater than a germanium fraction of an uppermost part of the base layer.

12. The semiconductor device of claim 11, wherein the epitaxial layer is formed along a profile of the fin type active pattern protruding above an upper surface of the field insulating film.

13. The semiconductor device of claim 12, wherein the channel layer extends between the epitaxial layer and the fin type active pattern.

14. The semiconductor device of claim 13, further comprising:
a source/drain region within the epitaxial layer, the channel layer and the fin type active pattern.

15. The semiconductor device of claim 11, wherein the substrate further includes a second silicon germanium layer formed on the first silicon germanium layer, and
the second silicon germanium layer has a constant germanium fraction over a thickness thereof.

16. The semiconductor device of claim 15, wherein second silicon germanium layer and the fin type active pattern are an integral structure.

17. The semiconductor device of claim 16, wherein the germanium fraction of the second silicon germanium layer is greater than the germanium fraction of the first silicon germanium layer at an uppermost part thereof.

18. The semiconductor device of claim 15, wherein the base layer includes a silicon substrate, and a third silicon germanium layer on the silicon substrate, and
the germanium fraction of the second silicon germanium layer is greater than a germanium fraction of an uppermost part of the third silicon germanium layer.

19. The semiconductor device of claim 11, wherein the base layer includes a silicon substrate, and a second silicon germanium layer on the silicon substrate, and a germanium fraction of an uppermost part of the second silicon germanium layer is smaller than the germanium fraction of the first silicon germanium layer at the lowermost part thereof, and further comprising a third silicon germanium layer on the first silicon germanium layer opposite the second silicon germanium layer, wherein the germanium fraction of the lowermost part of the first silicon germanium layer is greater than a germanium fraction of an uppermost part of the third silicon germanium layer.

20. The semiconductor device of claim 11, further comprising:
an insulating film pattern disposed within the substrate.

21. A semiconductor device, comprising:
a substrate;
a strain released layer on the substrate, the strain released layer having a lattice constant that is larger than a lattice constant of a directly underlying layer at an interface therewith; and
a strain relaxed buffer layer directly on the strain released layer opposite the underlying layer,
wherein the lattice constant of the strain released layer decreases from the interface with the underlying layer to an interface with the strain relaxed buffer layer directly thereon, and wherein the strain released layer, the underlying layer, and the strain relaxed buffer layer comprise a same compound semiconductor material.

22. The semiconductor device of claim 21, wherein the lattice constant of the strain released layer decreases continuously or in a stepwise manner from the interface with the underlying layer to the interface with the strain relaxed buffer layer directly thereon.

23. The semiconductor device of claim 22, wherein a lattice constant of the strain relaxed buffer layer is substantially uniform over a thickness thereof.

24. The semiconductor device of claim 22, wherein a lattice constant of the strain relaxed buffer layer at the interface with the strain released layer is larger than, smaller than, or equal to the lattice constant of the underlying layer, and wherein the lattice constant of the strain released layer at the interface with the underlying layer is larger than a lattice constant of the strain relaxed buffer layer distal from the interface with the strain released layer.

25. The semiconductor device of claim 22, wherein a lattice constant of the underlying layer and/or the strain relaxed buffer layer increases with distance from the substrate.

* * * * *